US012446226B2

(12) United States Patent
Kim et al.

(10) Patent No.: US 12,446,226 B2
(45) Date of Patent: Oct. 14, 2025

(54) MEMORY DEVICE AND METHOD OF MANUFACTURING THE SAME

(71) Applicant: SK hynix Inc., Icheon-si (KR)

(72) Inventors: Jae Taek Kim, Icheon-si (KR); Hye Yeong Jung, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 867 days.

(21) Appl. No.: 17/697,221

(22) Filed: Mar. 17, 2022

(65) Prior Publication Data

US 2023/0094910 A1 Mar. 30, 2023

(30) Foreign Application Priority Data

Sep. 24, 2021 (KR) .................. 10-2021-0126340

(51) Int. Cl.
*H10B 43/40* (2023.01)
*H10B 41/41* (2023.01)
(52) U.S. Cl.
CPC ............. *H10B 43/40* (2023.02); *H10B 41/41* (2023.02)

(58) Field of Classification Search
CPC ........ H10B 43/40; H10B 41/41; H10B 41/50; H10B 43/50; H10B 41/40; H10D 1/47; H10D 84/811; H10D 84/0149; H10D 84/209

See application file for complete search history.

(56) References Cited

U.S. PATENT DOCUMENTS 10,818,690 B2 * 10/2020 Eom ...................... H10B 43/10

FOREIGN PATENT DOCUMENTS

| KR | 1020170131945 A | 12/2017 |
| KR | 1020200127106 A | 11/2020 |

* cited by examiner

*Primary Examiner* — David Vu
(74) *Attorney, Agent, or Firm* — WILLIAM PARK AND ASSOCIATES LTD.

(57) ABSTRACT

A memory device, and a method of manufacturing the same, includes a source layer over which a cell region and a peripheral circuit region are defined, memory blocks formed on the source layer in the cell region, and a slit formed between the memory blocks. The memory device also includes a resistor formed in the source layer in the peripheral circuit region, contacts formed on the resistor, and metal lines formed on the contacts and connected to a peripheral circuit.

10 Claims, 28 Drawing Sheets

MEMORY DEVICE AND METHOD OF MANUFACTURING THE SAME

CROSS-REFERENCE TO RELATED APPLICATION

The present application claims priority under 35 U.S.C. § 119(a) to Korean patent application number 10-2021-0126340, filed on Sep. 24, 2021, in the Korean Intellectual Property Office, the entire disclosure of which is incorporated herein by reference.

BACKGROUND

1. Technical Field

The present disclosure relates to a memory device and a method of manufacturing the same, and more particularly, to a memory device including a resistor unit and a method of manufacturing the same.

2. Related Art

In order to improve an integration degree for memory devices, a three-dimensional memory device including pluralities of memory cells arranged in a three dimensions has been proposed.

Although the number of stacked memory cells stacked on a substrate may be increased to improve the integration degree of the three-dimensional memory device, there is a limit in reducing a size of the memory device as the number of elements included in the memory device increases.

SUMMARY

An embodiment of the present disclosure provides a memory device and a method of manufacturing the same capable of reducing a size of the memory device.

According to an embodiment of the present disclosure, a memory device includes a source layer over which a cell region and a peripheral circuit region are defined, memory blocks formed on the source layer in the cell region, a slit formed between the memory blocks, a resistor formed in the source layer in the peripheral circuit region, contacts formed on the resistor, and metal lines formed on the contacts and connected to a peripheral circuit.

According to an embodiment of the present disclosure, a method of manufacturing a memory device includes providing a source layer over which a cell region and a peripheral circuit region are defined and a slit region crossing the cell region is defined, forming an etch stop layer on the source layer in the slit region and on the source layer in the peripheral circuit region, forming a stack structure on the etch stop layer and the source layer, forming a first trench in the slit region by etching a portion of the stack structure in the slit region until the etch stop layer is exposed, filling the first trench with first insulating layer, forming contact holes exposing a portion of the etch stop layer in a dummy structure remaining in the peripheral circuit region of the stack structure, forming contacts in contact with the etch stop layer in the peripheral circuit region by filling the contact holes with a first conductive material, and forming metal lines over the contacts.

According to an embodiment of the present technology, a size of the memory device may be reduced by using dummy elements which are not used in a peripheral circuit region of the memory device as a resistor unit.

DETAILED DESCRIPTION

Specific structural or functional descriptions of embodiments according to the concept of the present disclosure which are disclosed in the present specification or application are illustrated only to describe the embodiments according to the concept of the present disclosure. The embodiments according to the concept of the present disclosure may be carried out in various forms and should not be construed as being limited to the embodiments described in the present specification or application.

Figure 1:
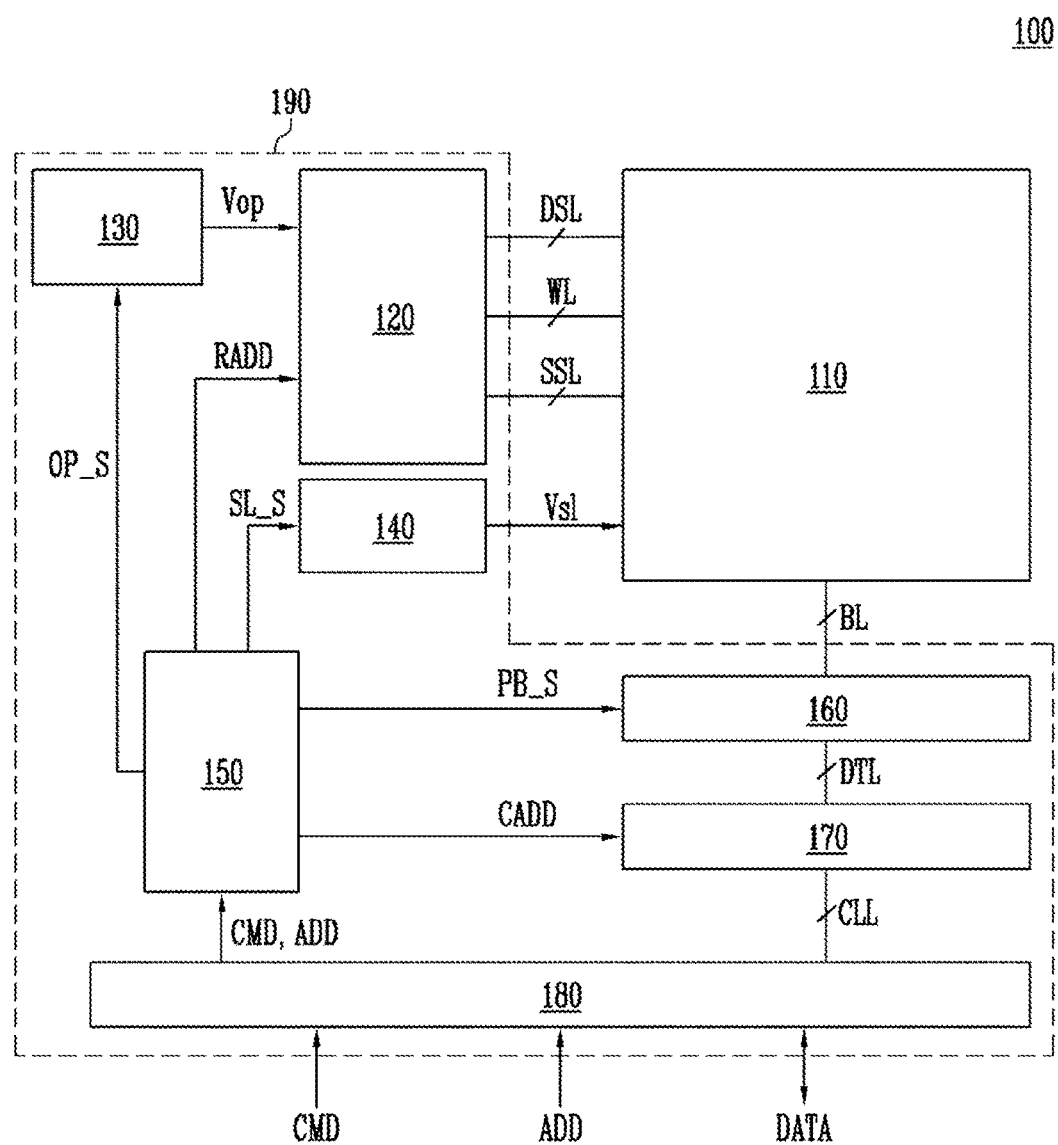
FIG. 1 is a diagram illustrating a memory device according to an embodiment of the present disclosure.

FIG. 1 is a diagram illustrating a memory device 100 according to an embodiment of the present disclosure.

Referring to FIG. 1, the memory device 100 may include a memory cell array 110 and a peripheral circuit 190.

The memory cell array 110 may include a plurality of memory cells in which data is stored. In an embodiment, the memory cell array 110 may be a three-dimensional memory cell array. According to a program method, the plurality of memory cells may store single-bit data or multi-bit data of two or more bits. The plurality of memory cells may be configured as a plurality of memory cell strings. For example, each of the memory cell strings may include a plurality of memory cells connected in series through a channel layer. The channel layer may be connected between a plurality of bit lines BL and a source line.

The peripheral circuit 190 may be configured to perform a program operation for storing data in the memory cell array 110, a read operation for outputting data stored in the memory cell array 110, and an erase operation for erasing data stored in the memory cell array 110. The peripheral circuit 190 may include a row decoder 120, a voltage generation circuit 130, a source line driver 140, a control circuit 150, a page buffer group 160, a column decoder 170, and an input/output circuit 180.

The row decoder 120 may be connected to the memory cell array 110 through a plurality of drain select lines DSL, a plurality of word lines WL, and a plurality of source select lines SSL. The row decoder 120 may transmit operation voltages Vop to the plurality of drain select lines DSL, the plurality of word lines WL, and the plurality of source select lines SSL in response to a row address RADD.

The voltage generation circuit 130 may generate the various operation voltages Vop used for the program operation, the read operation, or the erase operation in response to an operation signal OP_S.

The source line driver 140 may transmit a source voltage Vsl supplied from the source line driver 140 to a source line connected to the memory cell array 110, in response to a source line control signal SL_S.

The control circuit 150 may output the operation signal OP_S, the row address RADD, the source line control signal SL_S, a page buffer control signal PB_S, and a column address CADD, in response to a command CMD and an address ADD.

The page buffer group 160 may include a plurality of page buffers connected to the memory cell array 110 through the bit line BL. The page buffers may temporarily store data DATA received through the plurality of bit lines BL in response to the page buffer control signal PB_S. The page buffers may sense a voltage or a current of the plurality of bit lines BL during the read operation.

The column decoder 170 may transmit the data DATA input from the input/output circuit 180 to the page buffer group 160, or transmit the data DATA stored in the page buffer group 160 to the input/output circuit 180, in response to the column address CADD. The column decoder 170 may exchange the data DATA with the input/output circuit 180 through column lines CLL. The column decoder 170 may exchange the data DATA with the page buffer group 160 through data lines DTL.

The input/output circuit 180 may transmit the command CMD and the address ADD received from an external device (for example, a controller) of the memory device 100 to the control circuit 150, and output data read from selected memory cells to the external device during the read operation.

Figure 2A:
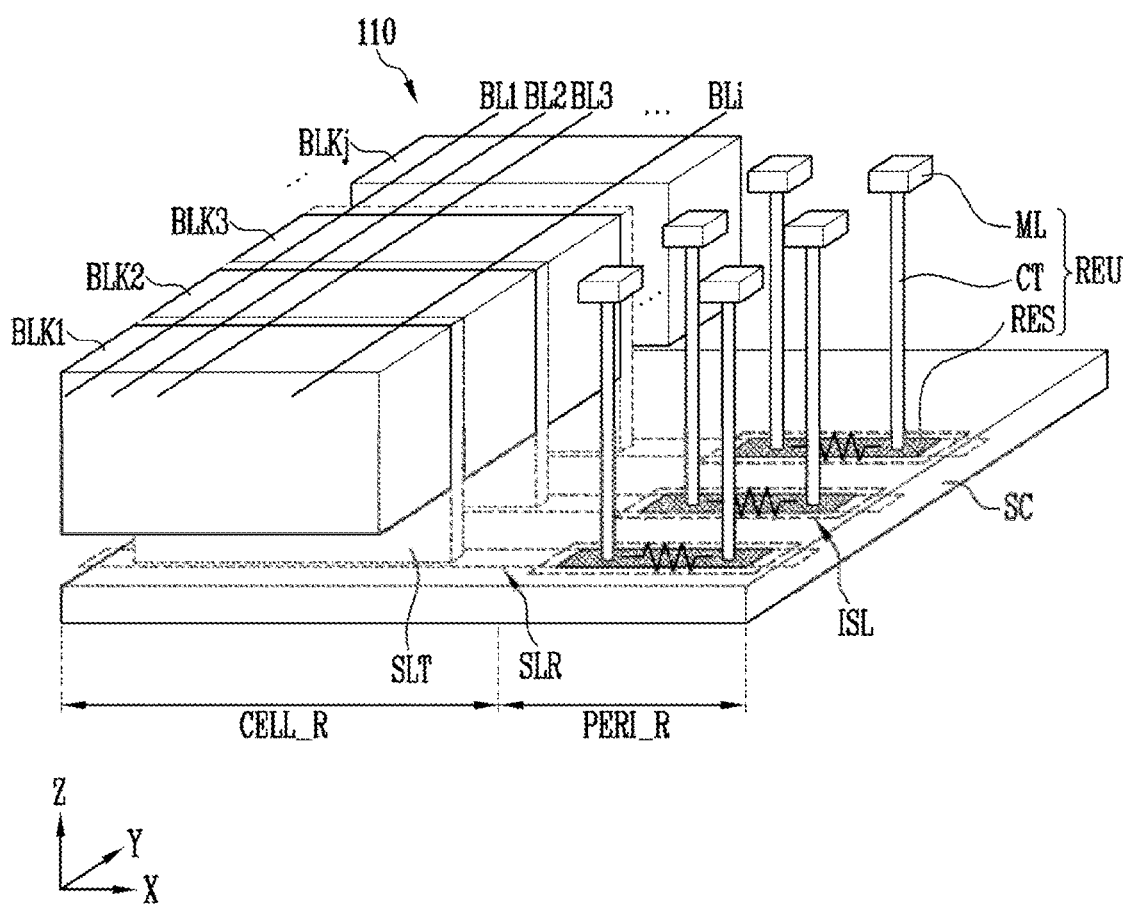
FIGS. 2A and 2B are diagrams illustrating a cell region and a peripheral circuit region according to an embodiment of the present disclosure.
Figure 2B:
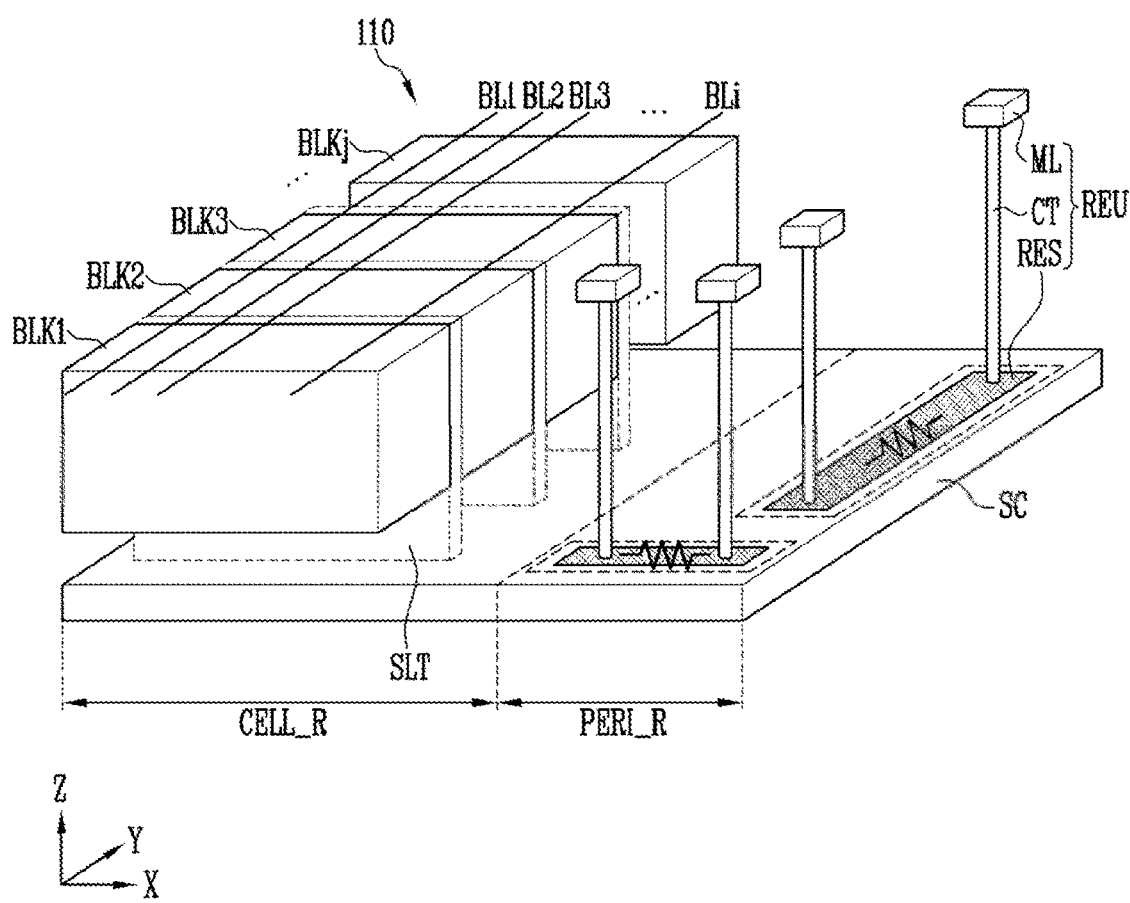

FIGS. 2A and 2B are diagrams illustrating a cell region and a peripheral circuit region according to an embodiment of the present disclosure.

Referring to FIG. 2A, the memory device 100 may include a cell region CELL_R configured to store data and a peripheral circuit region PERI_R configured to perform the program, read, or erase operation. The memory cell array 110 may be formed in the cell region CELL_R, and the peripheral circuit 190 shown in FIG. 1 may be formed in the peripheral circuit region PERI_R.

The memory cell array 110 may include first to j-th memory blocks BLK1 to BLKj (j is a positive integer). The first to j-th memory blocks BLK1 to BLKj may be separated from each other by slits SLT, and may share first to i-th bit lines BL1 to BLi. For example, when the first to i-th bit lines BL1 to BLi are disposed to be spaced apart from each other in a first direction (X direction) and extend in a second direction (Y direction), the first to j-th memory blocks BLK1 to BLKj may be disposed to be separated from each other by the slits SLT along the second direction (Y direction). A source layer SC may be disposed under the first to j-th memory blocks BLK1 to BLKj. That is, the first to j-th memory blocks BLK1 to BLKj may be stacked on the source layer SC along a third direction (Z direction). Because the first to j-th memory blocks BLK1 to BLKj are formed in the cell region CELL_R, a layer formed in the cell region CELL_R of the source layer SC may be used as a source line connected to the first to j-th memory blocks BLK1 to BLKj.

The slits SLT dividing the first to j-th memory blocks BLK1 to BLKj may be formed in a slit region SLR. Trenches may be formed in the slit region SLR, and the slits SLT may be formed in the trenches. An etch stop layer may be used during an etching process for forming the trenches in the slit region SLR, and in the present embodiment, a portion of the etch stop layer formed in the peripheral circuit region PERI_R may be used as resistors RES. That is, an etch stop layer formed in the slit region SLR is a layer which is not used after the etching process for forming a trench in the slit region SLR is completed, but in the present embodiment, the etch stop layer remaining in the peripheral circuit region PERI_R is used as a resistor RES.

Because the source layer SC may be formed of a conductive layer and the etch stop layer formed in the slit region SLR may also be formed of a conductive layer, in order to use a portion of the etch stop layer as the resistor RES, an insulating layer ISL may be formed around the etch stop layer for the resistor RES. In order to connect the resistor RES with the peripheral circuit, contacts CT may be formed on one side and another side of the resistor RES, and metal lines ML may be formed on the contacts CT. Although not shown in the drawing, the metal lines ML may be connected to the peripheral circuits included in the peripheral circuit region PERI_R. Accordingly, a resistor unit REU including the resistor RES, the contacts CT, and the metal lines ML may be configured.

Referring to FIG. 2B, the resistor unit REU formed in the peripheral circuit region PERI_R may be formed in the peripheral circuit region PERI_R even though the resistor unit REU formed in the peripheral circuit region PERI_R is not on an extension line of the slit SLT formed in the cell region CELL_R. For example, even though the slit SLT is formed to extend in the first direction (X direction) in the cell region CELL_R, the resistor unit REU may be formed in the first direction (X direction) or the second direction (X direction) in the peripheral circuit region PERI_R. Although not in the first or second direction (X or Y direction), the resistor unit REU formed in the peripheral circuit region PERI_R may have various patterns extending in various directions.

As described above, by forming the resistor RES simultaneously during a process for forming the slit SLT, a manufacturing time for forming the resistor unit REU may be shortened. In addition, because the contacts CT formed on the resistor RES pass through a dummy structure (not shown) formed in the peripheral circuit region PERI_R, a region in which the dummy structure is formed may be used as a region for forming the resistor unit REU. Therefore, a size of the memory device 100 may be reduced.

Figure 3:
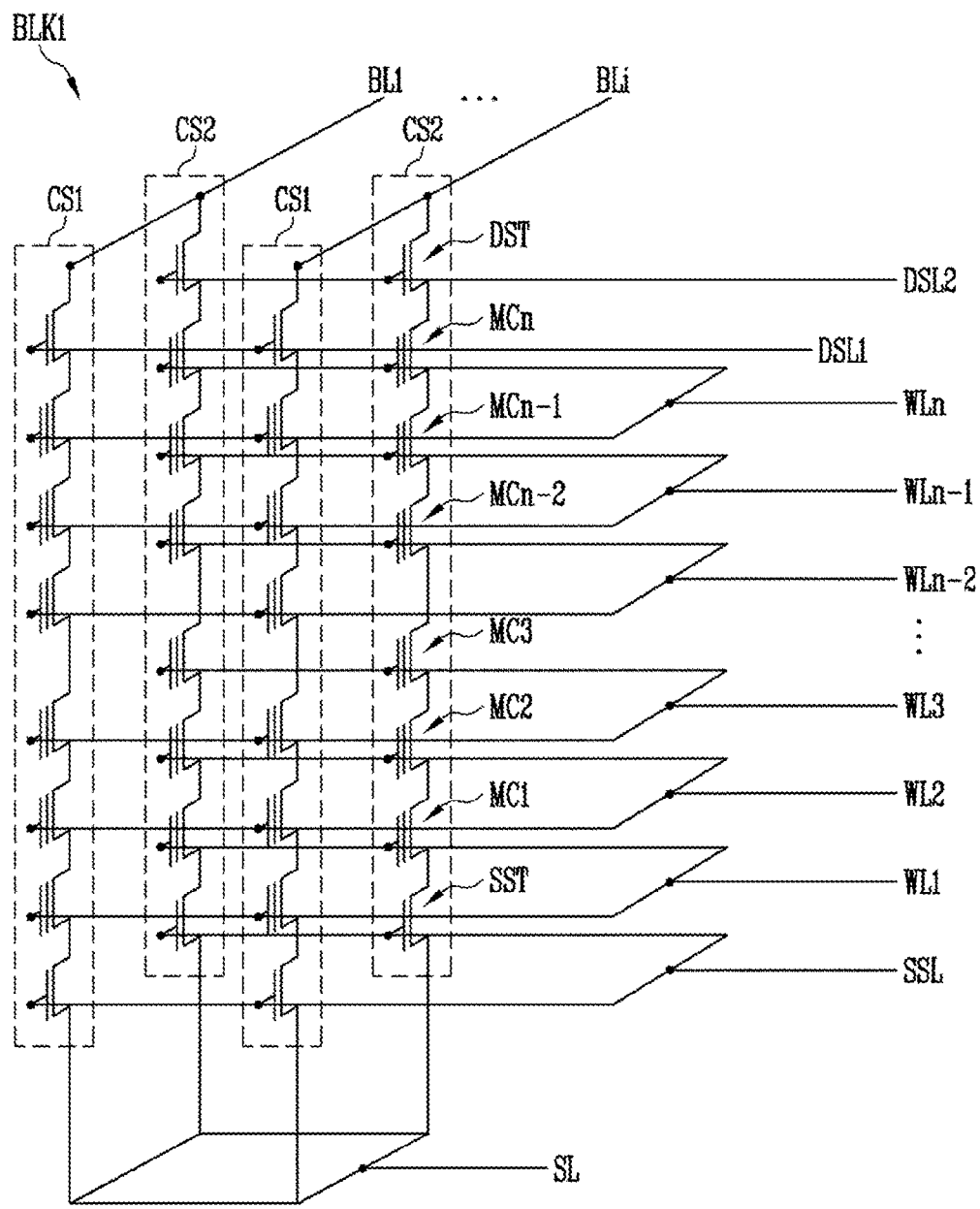
FIG. 3 is a diagram illustrating a memory block according to an embodiment of the present disclosure.

FIG. 3 is a diagram illustrating a memory block according to an embodiment of the present disclosure.

Because the first to j-th memory blocks BLK1 to BLKj shown in FIG. 2 are configured identically to each other, in FIG. 3, the first memory block BLK1 among the first to j-th memory blocks BLK1 to BLKj is shown as an example.

Referring to FIG. 3, a plurality of bit lines BL1 to BLi (i is a positive integer) may be connected to the first memory block BLK1, and a plurality of memory cell strings CS1 and CS2 may be connected to each of the plurality of bit lines BL1 to BLi. In FIG. 3, the two memory cell strings CS1 and CS2 are connected to one bit line, but the number of memory cell strings connected to one bit line may be greater than two.

The plurality of memory cell strings CS1 and CS2 may be commonly connected to a source line SL. In an embodiment, a plurality of first memory cell strings CS1 and a plurality of second memory cell strings CS2 may be commonly connected to the source line SL.

Each of the first memory cell strings CS1 and each of the second memory cell strings CS2 may include a source select transistor SST, a plurality of memory cells MC1 to MCn, and a drain select transistor DST connected between the source line SL and the bit lines BL1 to BLi.

The source select transistor SST may control an electrical connection between the plurality of memory cells MC1 to MCn and the source line SL. One source select transistor SST may be connected between the source line SL and the plurality of memory cells MC1 to MCn. Although not shown in FIG. 3, two or more source select transistors connected in series may be connected between the source line SL and the plurality of memory cells MC1 to MCn. A gate of the source select transistor SST may be connected to the source select line SSL. The source select transistor SST may be turned on or turned off in response to a voltage applied to the source select line SSL.

The plurality of memory cells MC1 to MCn may be disposed between the source select transistor SST and the drain select transistor DST. The plurality of memory cells MC1 to MCn between the source select transistor SST and the drain select transistor DST may be connected in series to each other. Gates of the plurality of memory cells MC1 to MCn may be connected to a plurality of word lines WL1 to WLn, respectively. An operation of the memory cells MC1 to MCn may be controlled by voltages applied to the word lines WL1 to WLn corresponding thereto. Memory cells connected to the same word line may configure a page, and memory cells may be selected in a page unit during the program or read operation.

The drain select transistor DST may control an electrical connection between the plurality of memory cells MC1 to MCn and the bit lines BL1 to BLi. A gate of the drain select transistor DST may be connected to a drain select line DSL1 or DSL2. An operation of the drain select transistor DST may be controlled by a voltage applied to the drain select line DSL1 or DSL2.

The first drain select line DSL1 may be connected to the plurality of first memory cell strings CS1, and the second drain select line DSL2 may be connected to the plurality of second memory cell strings CS2. Accordingly, by selecting one of the plurality of word lines WL1 to WLn and selecting one of the first drain select line DSL1 and the second drain select line DSL2, one page among pages included in the plurality of first memory cell strings CS1 or the plurality of second memory cell strings CS2 may be selected.

The plurality of first memory cell strings CS1 and the plurality of second memory cell strings CS2 may be commonly connected to the plurality of word lines WL1 to WLn.

A configuration of the first memory block BLK1 is not limited to the configuration shown in FIG. 3 and may be variously changed.

Figure 4:
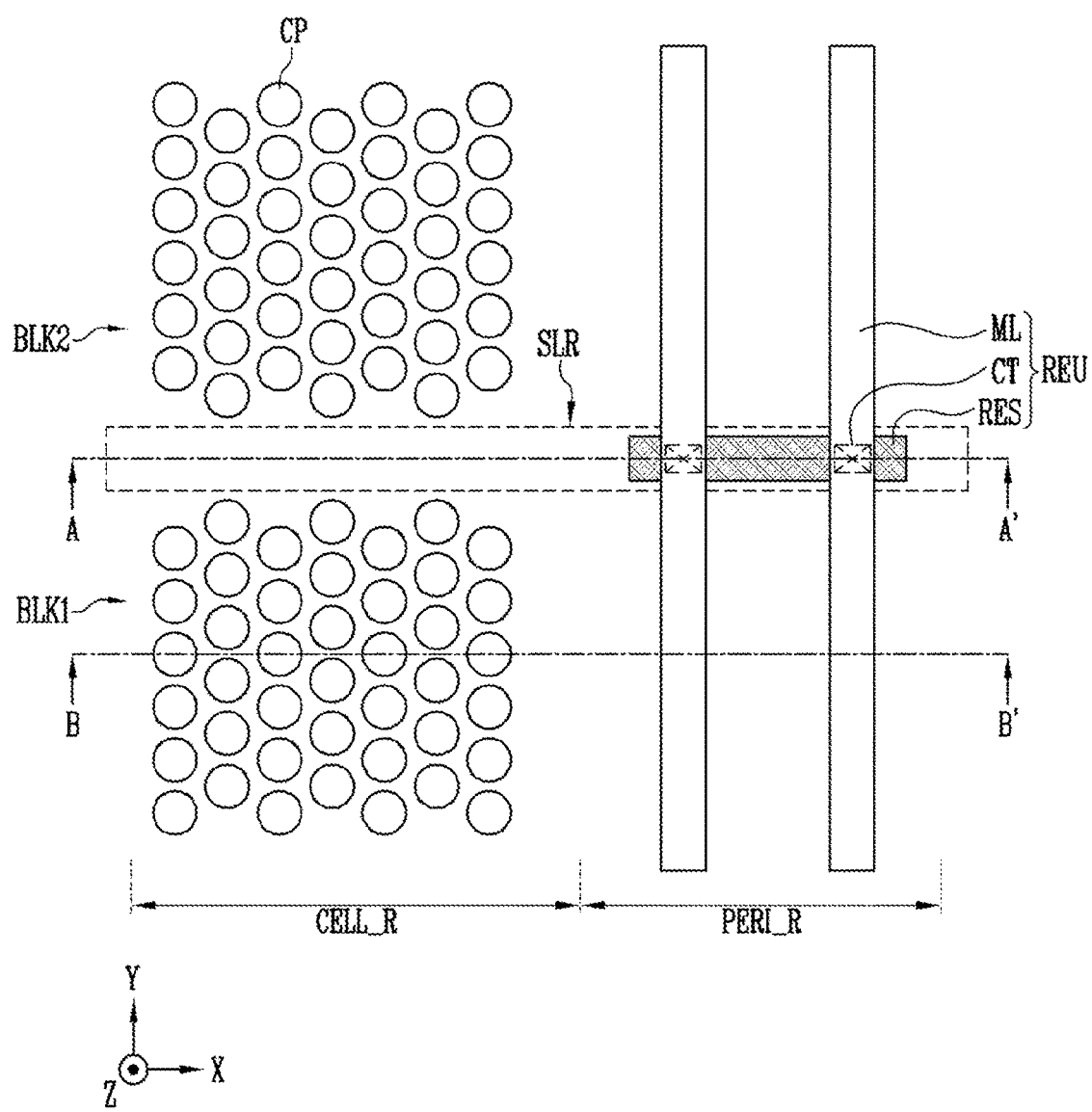
FIG. 4 is a diagram illustrating a layout of a resistor unit according to an embodiment of the present disclosure.

FIG. 4 is a diagram illustrating a layout of a resistor unit according to an embodiment of the present disclosure.

Referring to FIG. 4, a die on which the memory device is formed may include the cell region CELL_R and the peripheral circuit region PERI_R. A plurality of memory blocks BLK1 and BLK2 may be formed in the cell region CELL_R, and the peripheral circuits including the resistor unit REU may be formed in the peripheral circuit region PERI_R.

For example, first and second memory blocks BLK1 and BLK2 may be formed in the cell region CELL_R, and a plurality of channel plugs CP may be included in each of the first and second memory blocks BLK1 and BLK2. Stacked memory cells may be included in the plurality of channel plugs CP. The first and second memory blocks BLK1 and BLK2 may be divided from each other by the slit region SLR. The slit region SLR may cross the cell region CELL_R and the peripheral circuit region PERI_R. For example, when the cell region CELL_R and the peripheral circuit region PERI_R are adjacent to each other along the first direction (X direction), the slit region SLR may extend in the first direction (X direction). Therefore, the first and second memory blocks BLK1 and BLK2 may be spaced apart from each other along the second direction (Y direction) orthogonal to the first direction (X direction).

The resistor unit REU disposed in the peripheral circuit region PERI_R may include the resistor RES, the contacts CT, and the metal lines ML. The resistor RES may be disposed in the slit region SLR and may be electrically connected to the metal lines ML through the contacts CT. A layout of the metal lines ML may be variously implemented according to the design of a peripheral circuit using the resistor RES.

A manufacturing method of the resistor unit REU is described using a cross-section taken along a line A-A' or a line B-B' as follows.

FIGS. 5A to 20B are diagrams illustrating a method of manufacturing a memory device according to an embodiment of the present disclosure.

Figure 5A:
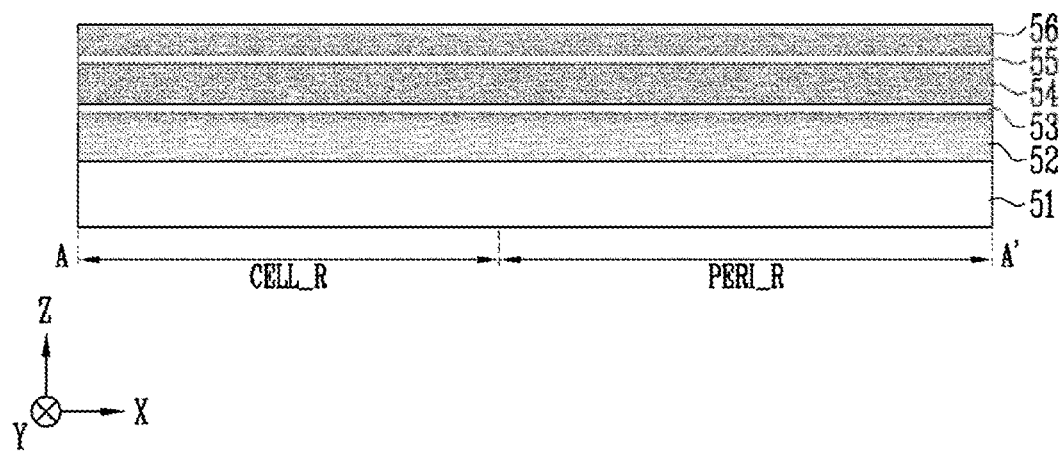
FIGS. 5A, 5B, 6A, 6B, 7, 8A, 8B, 9, 10A, 10B, 11, 12A, 12B, 13A, 13B, 14 to 19, 20A and 20B are diagrams illustrating a method of manufacturing a memory device according to an embodiment of the present disclosure.
Figure 5B:
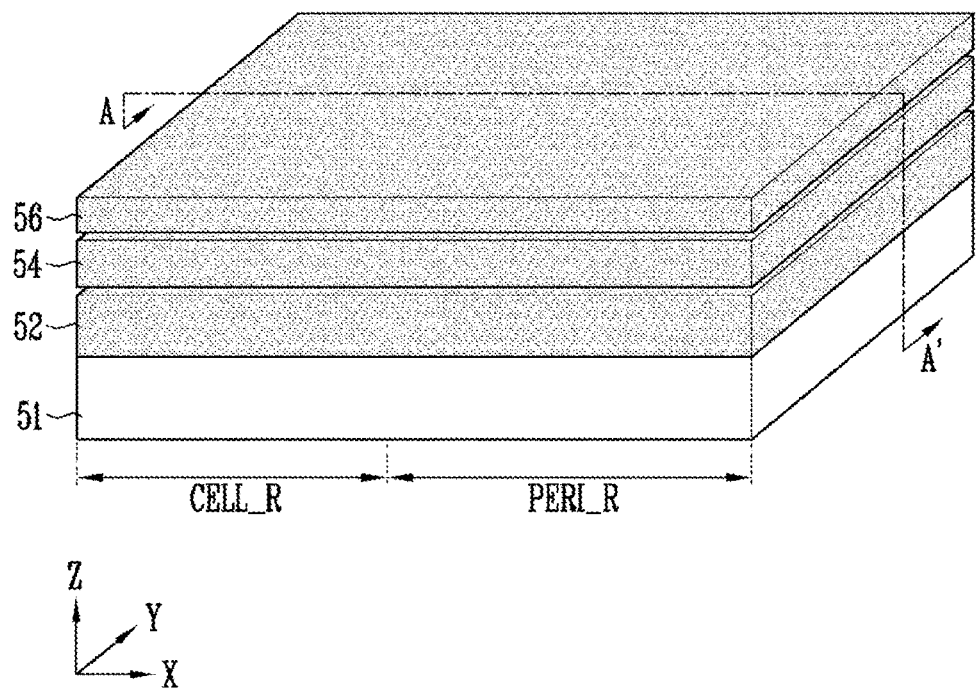

Referring to FIGS. 5A and 5B, first, second, and third source layers 52, 54, and 56 and first and second interlayer insulating layers 53 and 55 are alternately stacked on a lower structure 51. For example, the first source layer 52, the first interlayer insulating layer 53, the second source layer 54, the second interlayer insulating layer 55, and the third source layer 56 may be sequentially stacked on the lower structure 51. Although not shown in the drawing, an insulating layer may be further formed between the lower structure 51 and the first source layer 52. The first, second, and third source layers 52, 54, and 56 may be formed of a conductive material. For example, the first, second, and third source layers 52, 54, and 56 may be formed of polysilicon. The first and second interlayer insulating layers 53 and 55 may be formed of an oxide or silicon oxide. The number of the first, second, and third source layers 52, 54, and 56 and the first and second interlayer insulating layers 53 and 55 is not limited to the number shown in the drawing. The lower structure 51 may be a substrate or a peripheral circuit formed on the substrate.

Figure 6A:
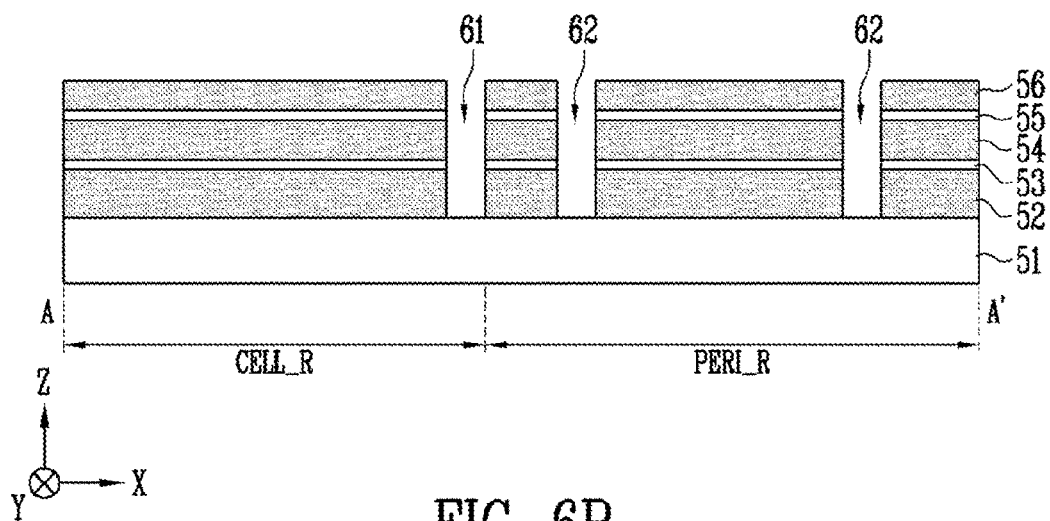
Figure 6B:
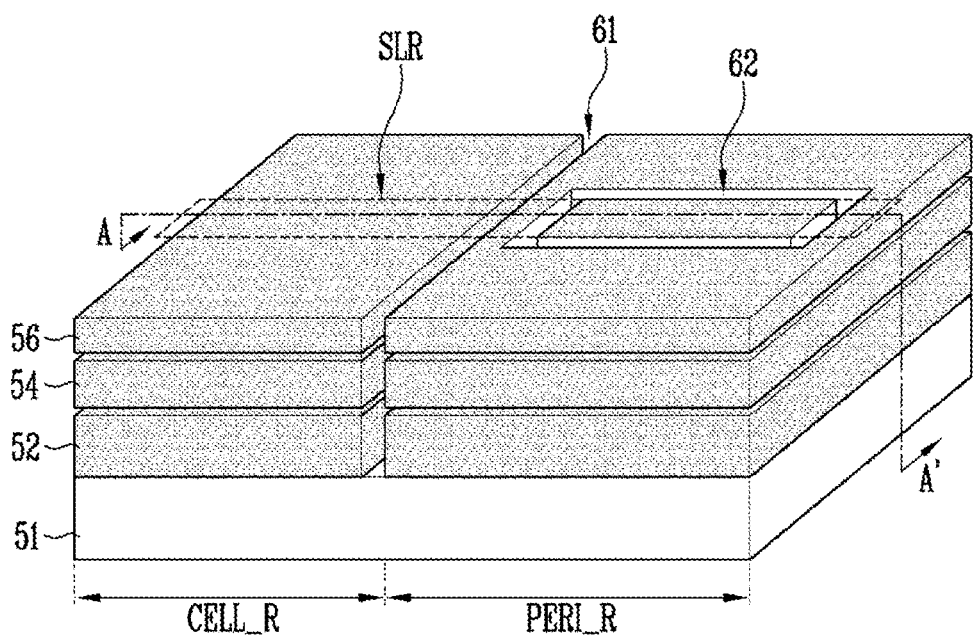

Referring to FIGS. 6A and 6B, a first trench 61 for dividing the cell region CELL_R and the peripheral circuit region PERI_R, a resistor to be formed in the peripheral circuit region PERI_R, and a second trench 62 for electrically blocking the first, second, and third source layers 52, 54, and 56 may be formed. The first and second trenches 61 and 62 may be formed by etching a portion of the first, second and third source layers 52, 54, 56 and the first and second interlayer insulating layers 53 and 55. An etching process for forming the first and second trenches 61 and 62 may be performed until the lower structure 51 is exposed.

The first trench 61 may be formed between the cell region CELL_R and the peripheral circuit region PERI_R, and the second trench 62 may be formed in the peripheral circuit region PERI_R. The first trench 61 may be formed in a line shape extending in the second direction (Y direction). Because the second trench 62 is formed to electrically block the resistor to be formed in a subsequent process and the first, second, and third source layers 52, 54, and 56, the second trench may be formed in a portion including a portion of the slit region SLR extending in the first direction (X direction). For example, the second trench 62 may be formed in a quadrangular box shape surrounding a portion of the first, second, and third source layers 52, 54, and 56 included in the slit region SLR and extending in the third direction (Z direction).

Figure 7:
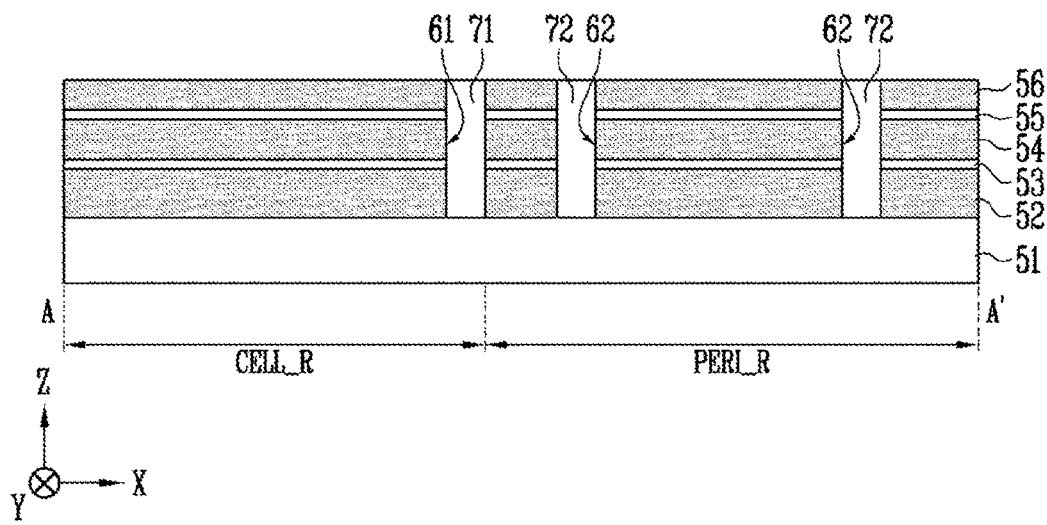

Referring to FIG. 7, first and second insulating layers 71 and 72 may be formed in the first and second trenches 61 and 62. The first and second insulating layers 71 and 72 may be simultaneously formed. The first insulating layer 71 may be formed in the first trench 61, and the second insulating layer 72 may be formed in the second trench 62. The first and second insulating layers 71 and 72 may be formed of an oxide or silicon oxide.

Figure 8A:
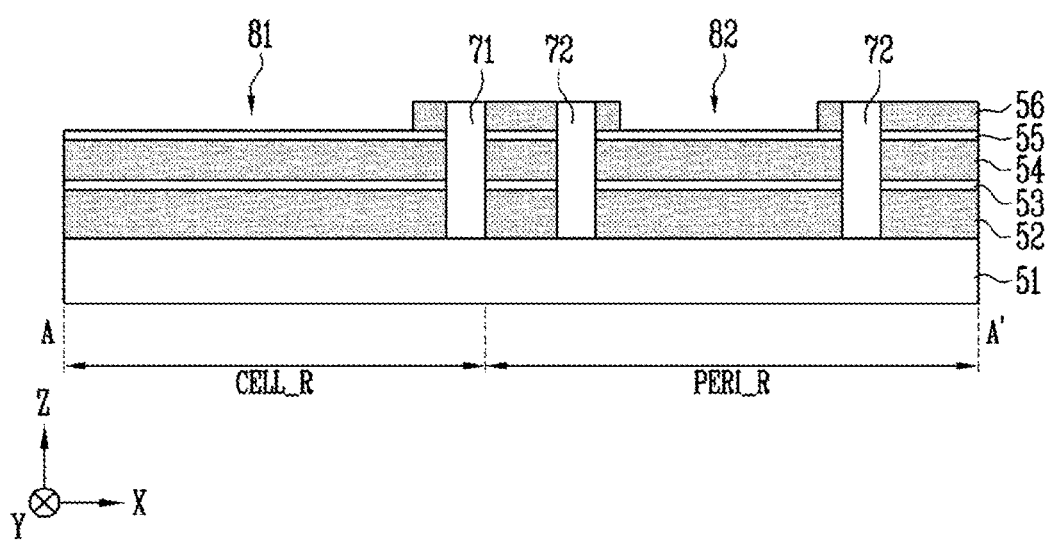
Figure 8B:
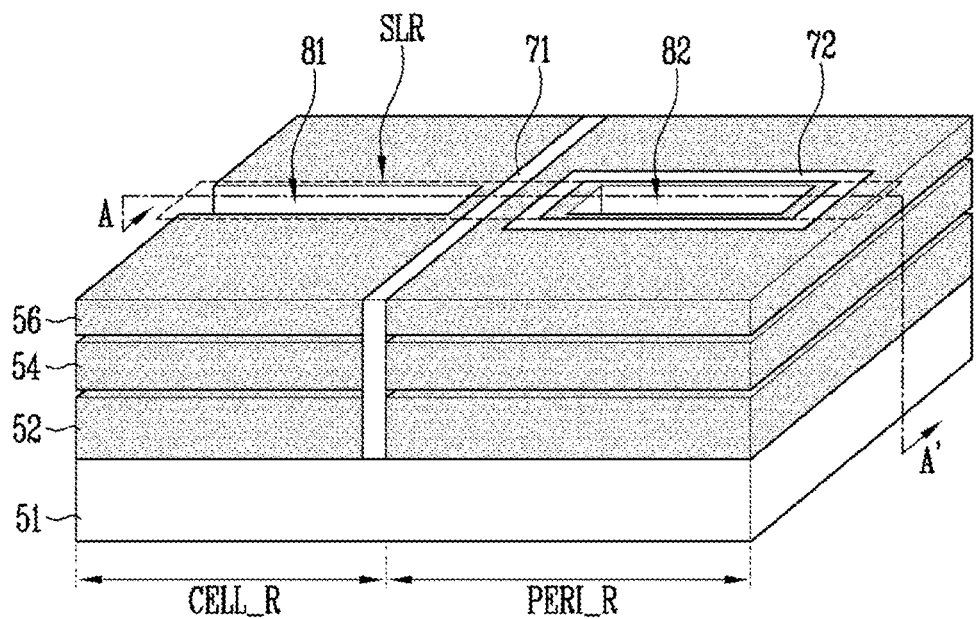
Figure 8B:

Referring to FIGS. 8A and 8B, third and fourth trenches 81 and 82 for forming the etch stop layer may be formed in the slit region SLR of the cell region CELL_R and the peripheral circuit region PERI_R. For example, the third trench 81 may be formed in the slit region SLR of the cell region CELL_R, and the fourth trench 82 may be formed in the slit region SLR of the peripheral circuit region PERI_R. The third and fourth trenches 81 and 82 may be formed by etching a portion of the third source layer 56 in the slit region SLR. For example, an etching process for forming the third and fourth trenches 81 and 82 may be performed until the second interlayer insulating layer 55 in the slit region SLR is exposed, but may also be performed to expose a portion of the third source layer 56 without exposing the second interlayer insulating layer 55.

Figure 9:
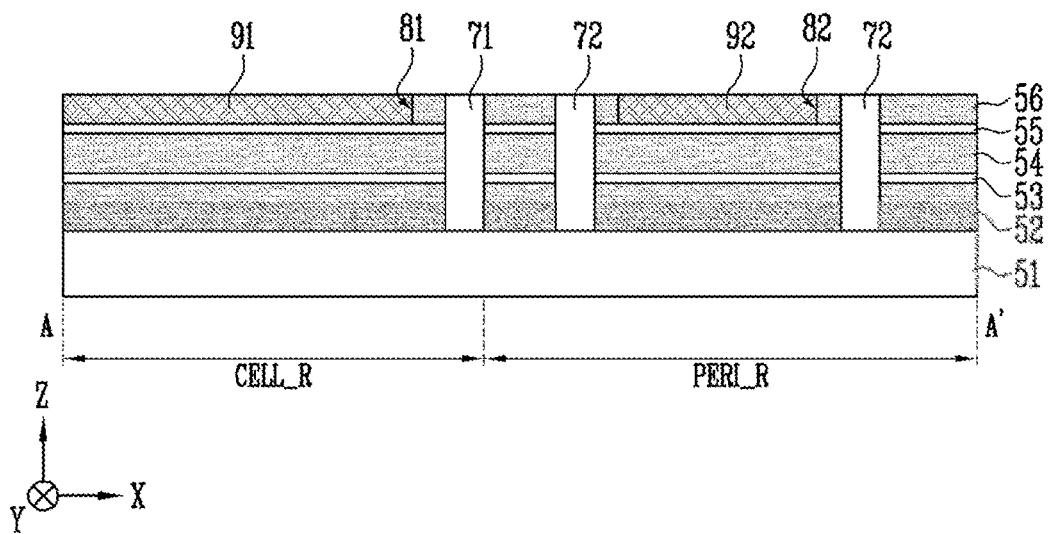
Figure 9:
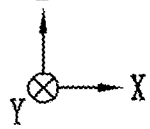

Referring to FIG. 9, first and second etch stop layers 91 and 92 may be formed in the third and fourth trenches 81 and 82. For example, the first etch stop layer 91 may be formed in the third trench 81, and the second etch stop layer 92 may be formed in the fourth trench 82. The first and second etch stop layers 91 and 92 may be simultaneously formed of the same material. The first and second etch stop layers 91 and 92 may be formed of a material having an etch selectivity different from that of the third source layer 56. For example, the first and second etch stop layers 91 and 92 may be formed of a conductive material. For example, the first and second etch stop layers 91 and 92 may be formed of tungsten (W), titanium (Ti), titanium nitride (TiN), or a mixture thereof.

Figure 10A:
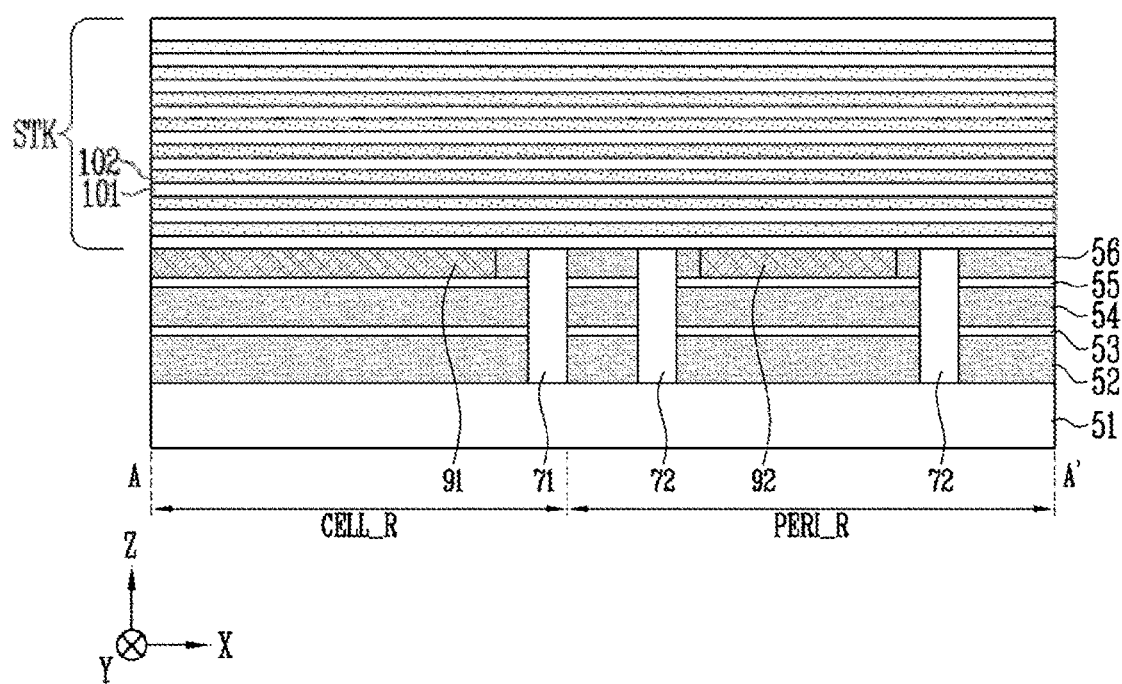
Figure 10B:
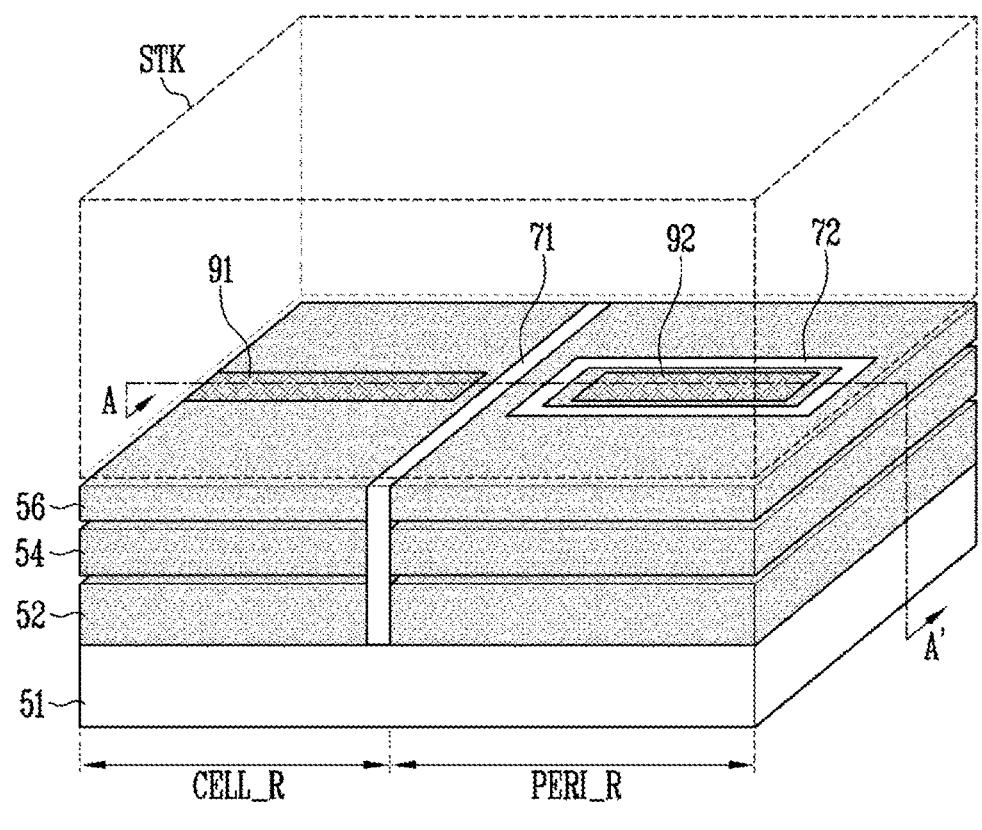

Referring to FIGS. 10A and 10B, a stack structure STK may be formed on the first and second etch stop layers 91 and 92, the third source layer 56, and the first and second insulating layers 71 and 72. The stack structure STK may include first material layers 101 and second material layers 102 that are alternately stacked. The first material layers 101 may be formed of an insulating material, and the second material layers 102 may be formed of a material having an etch selectivity different from that of the first material layers 101. For example, the first material layers 101 may be formed of an oxide layer, and the second material layers 102 may be formed of a nitride layer. In order to show a lower structure of the stack structure STK, in FIG. 10B, the stack structure STK is briefly shown in a box shape. However, both of the first and second material layers 101 and 102 shown in FIG. 10A are included also in the stack structure STK shown in FIG. 10B.

Figure 11:
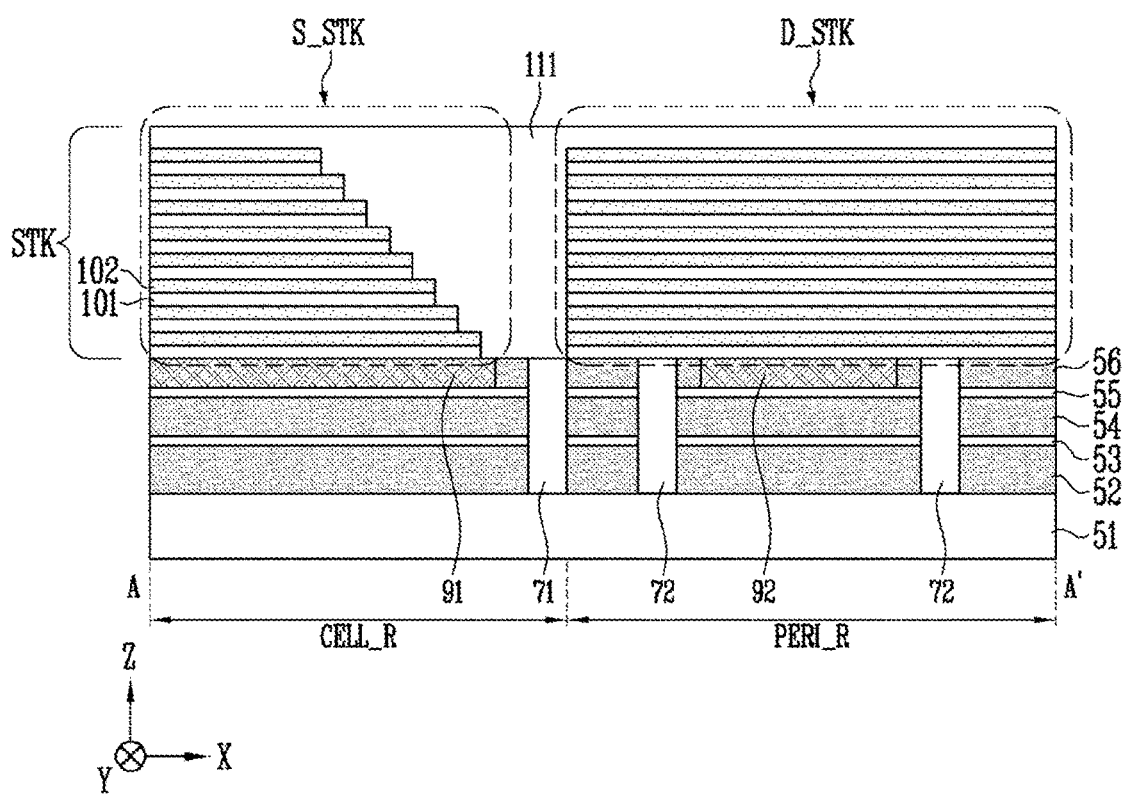

Referring to FIG. 11, a step structure S_STK may be formed by etching a portion of the first and second material layers 101 and 102 formed in the cell region CELL_R. For example, an etching process may be performed so that each of the first and each of the second material layers 101 and 102 stacked adjacent to each other form a pair to form a step shape. The step shape may be formed so that the second material layers 102 are exposed upwards. Although not shown in the drawing, contacts electrically connected to the peripheral circuits may be formed on the second material layers 102 exposed to each layer of the step structure S_STK in a subsequent process. The first and second material layers 101 and 102 remaining in the peripheral circuit region PERI_R may remain as a dummy structure D_STK. When the step structure S_STK is formed, a third interlayer insulating layer 111 may be formed to cover both of the step structure S_STK and the dummy structure D_STK.

Figure 12A:
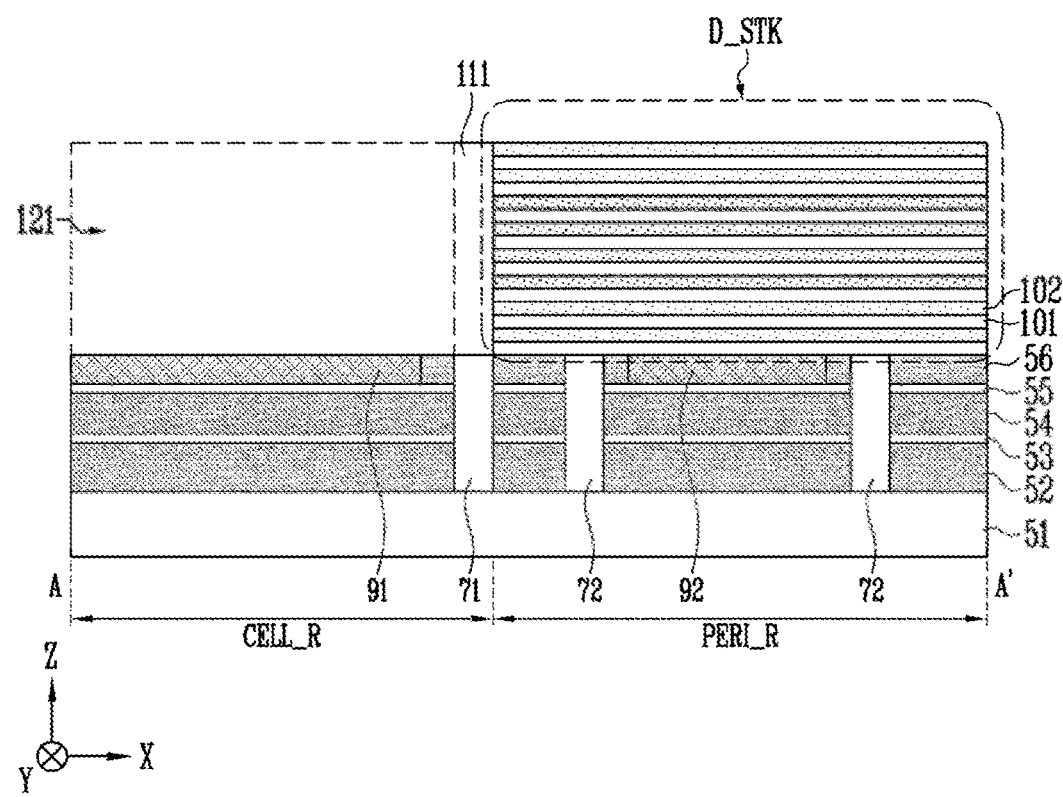
Figure 12B:
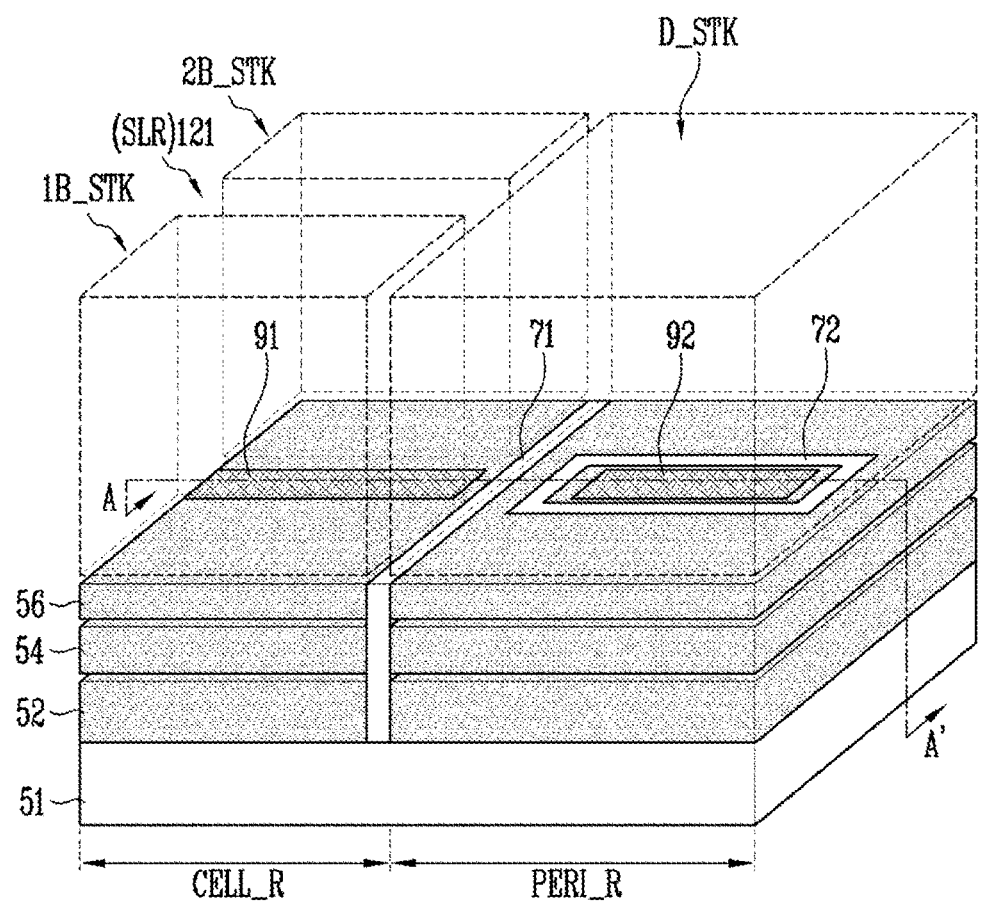

Referring to FIGS. 12A and 12B, a fifth trench 121 for dividing memory blocks may be formed by etching the stack structure STK of FIG. 11 formed in the slit region SLR. An etching process for forming the fifth trench 121 may be performed until the first etch stop layer 91 formed in the cell region CELL_R is exposed. That is, when the first etch stop layer 91 is exposed, the etching process for forming the fifth trench 121 may be stopped. The fifth trench 121 may be formed to cross the stack structure STK in the first direction (X direction). Therefore, the stack structure STK may be divided into first and second block structures 1B_STK and 2B_STK based on the fifth trench 121 as a boundary. In order to describe a structure formed under the stack structure STK, in FIG. 12B, the first and second block structures 1B_STK and 2B_STK and the dummy structure D_STK are briefly shown in a box shape. However, both of the first and second material layers 101 and 102 shown in FIG. 12A are included also in the first and second block structures 1B_STK and 2B_STK and the dummy structure D_STK shown in FIG. 12B.

Figure 13A:
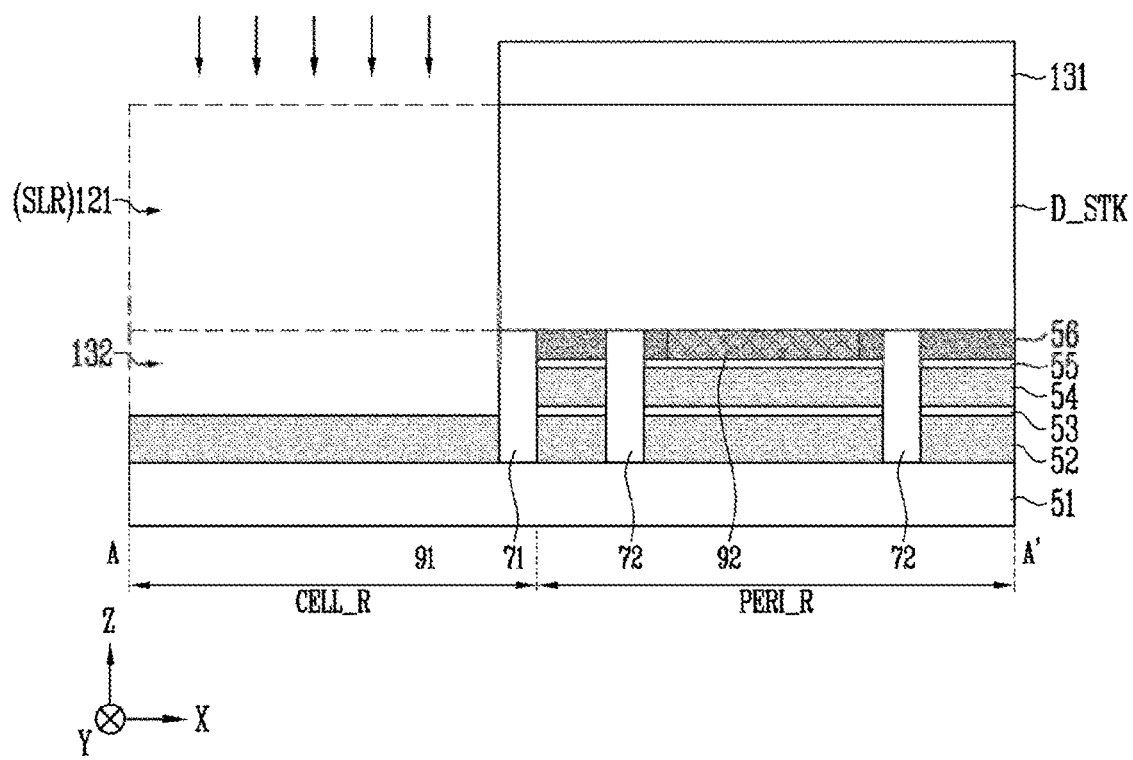
Figure 13B:
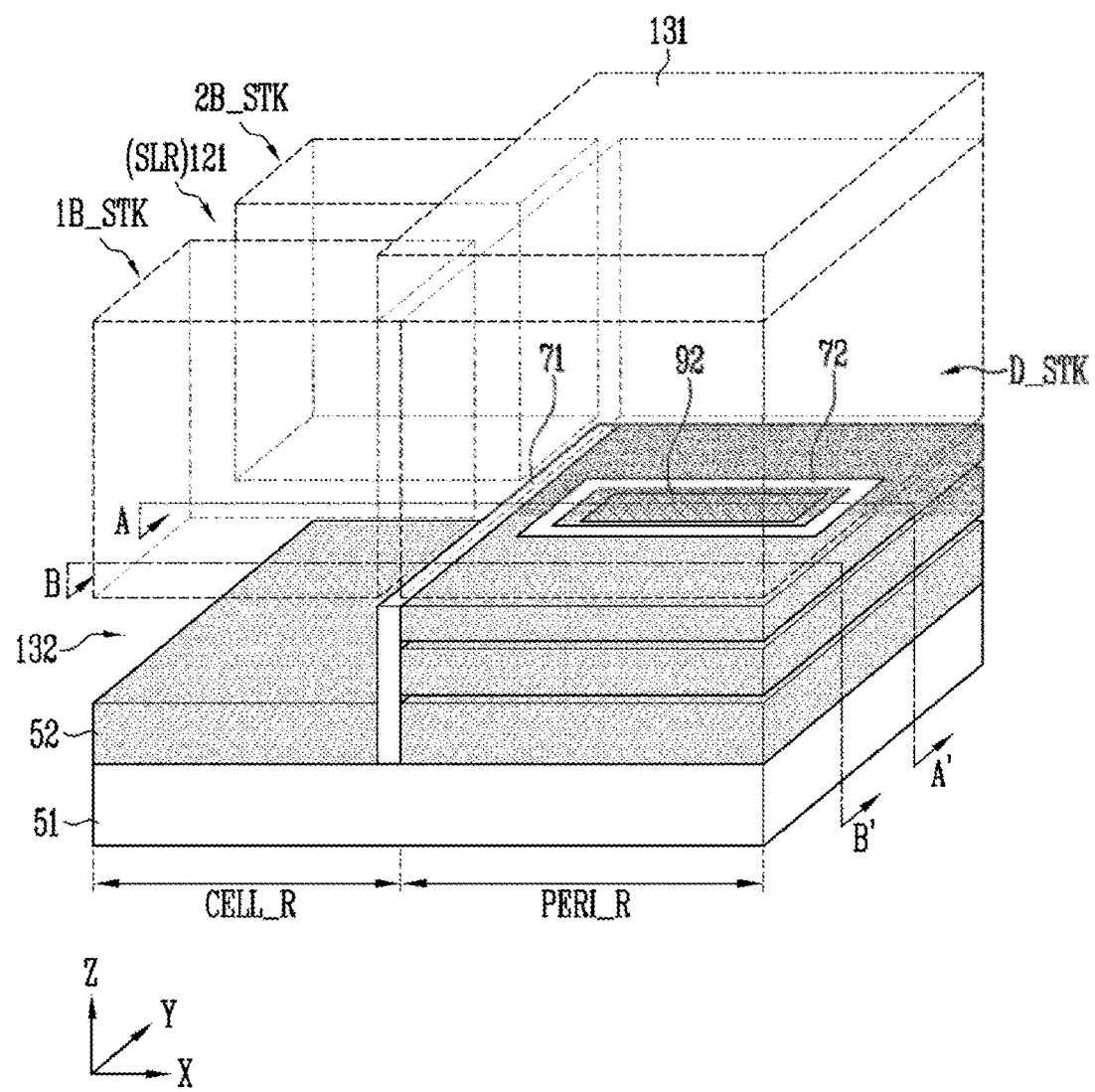

Referring to FIGS. 13A and 13B, an etching process for forming a sixth trench 132 under the fifth trench 121 formed in the cell region CELL_R may be performed. For example, a first mask pattern 131 exposing the cell region CELL_R may be formed on the dummy structure D_STK, and an etching process using the first mask pattern 131 as an etching mask may be performed. The etching process may be performed so that the first etch stop layer 91 of FIG. 12A, the third source layer 56, the second interlayer insulating layer 55, the second source layer 54, and the first interlayer insulating layer 53 exposed through the fifth trench 121 of the cell region CELL_R are removed. After the sixth trench 132 is formed in the cell region CELL_R, the first mask pattern 131 is removed.

Figure 14:
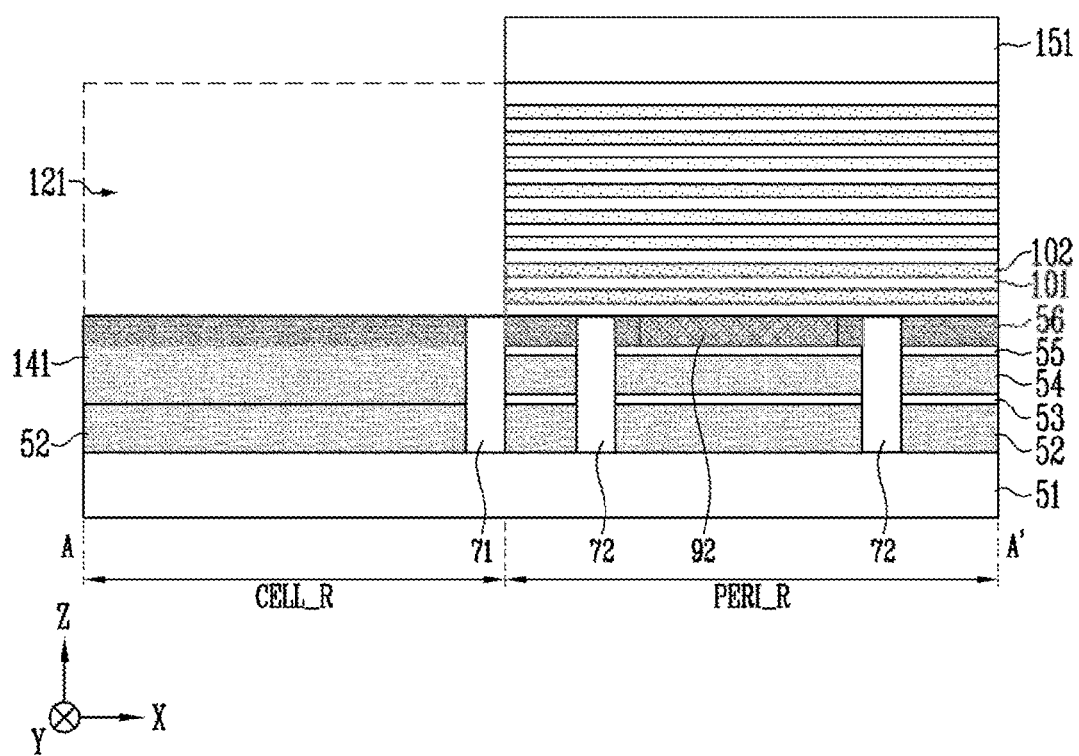

Referring to FIG. 14, a step for forming a fourth source layer 141 in the sixth trench 132 may be performed. Because the first source layer 52 is exposed through an inside of the sixth trench 132 in the cell region CELL_R, when the sixth trench 132 is filled with the fourth source layer 141, the fourth source layer 141 and the first source layer 52 are in contact with each other. The fourth source layer 141 may be formed of the same material as the first source layer 52 or may be formed of a conductive material. The first source layer 52 and the fourth source layer 141 formed in the cell region CELL_R may be used as the source line connected to the memory blocks.

Figure 15:
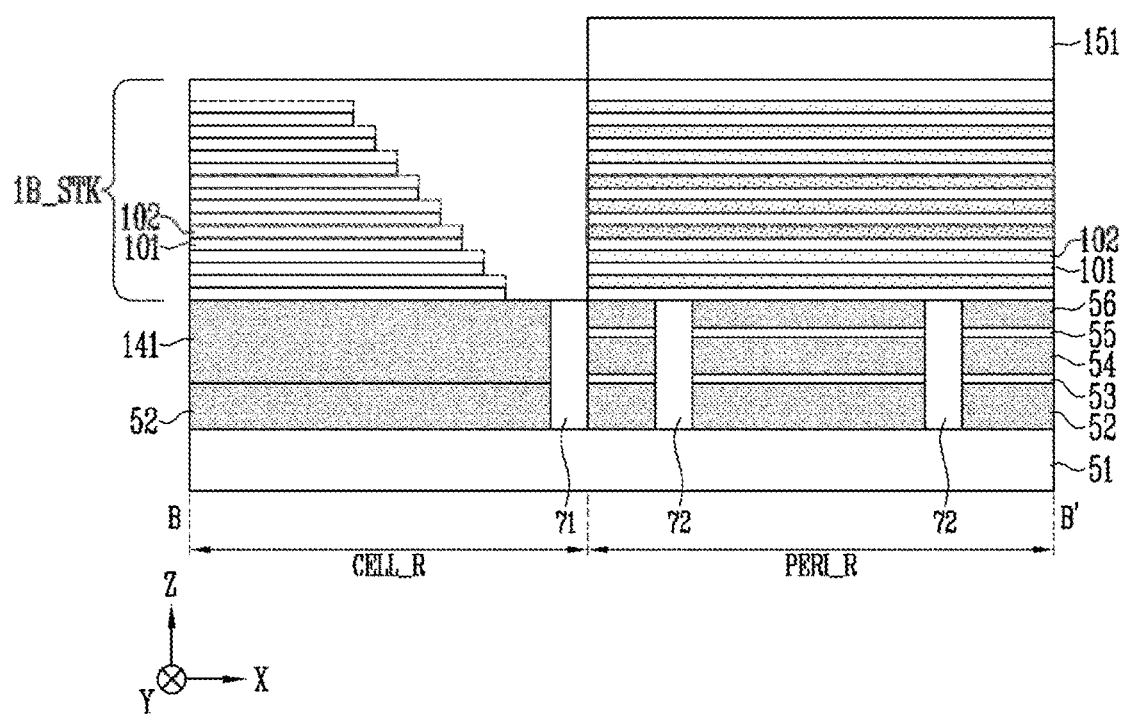
Figure 16:
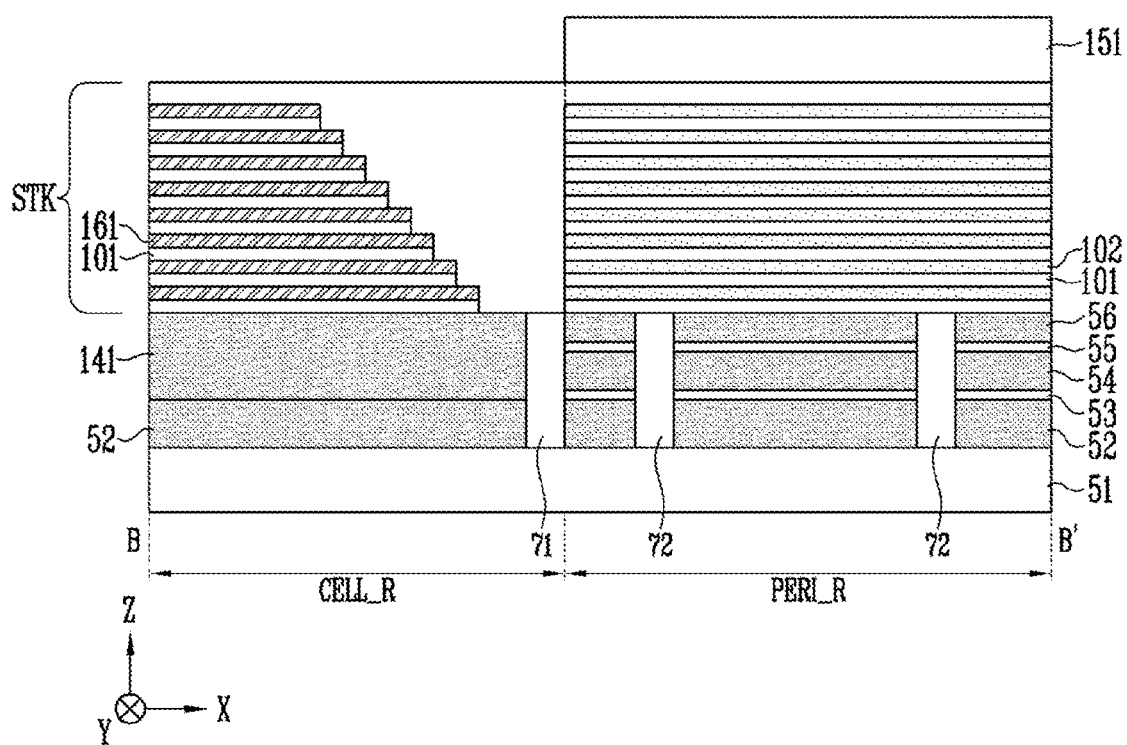

FIGS. 15 and 16 show a cross-section taken along a line B-B' of the first block structure 1B_STK of FIG. 13B.

Referring to FIG. 15, an etching process for removing the second material layers 102 formed in the cell region CELL_R may be performed. For example, in order to expose the fifth trench 121 of the cell region CELL_R, a second mask pattern 151 where the cell region CELL_R is opened may be formed in the peripheral circuit region PERI_R. The first and second material layers 101 and 102 may be exposed through an open region of the second mask pattern 151 and the fifth trench 121 of the cell region CELL_R, and an etching process for selectively removing the second material layers 102 among the first and second material layers 101 and 102 may be performed. For example, an isotropic etching process may be performed as the etching process. The etching process may be performed using an etching gas or an etchant of which an etch selectivity of the second material layer 102 is higher than that of the first material layer 101. The second material layers 102 of the first and second block structures 1B_STK and 2B_STK may be removed by the etching process, and the first material layers 101 may remain. Therefore, a recess that is an empty space may be formed between the first material layers 101 of the cell region CELL_R.

Referring to FIG. 16, the cross-section taken along the line B-B' of the cell region CELL_R and the peripheral circuit region PERI_R is shown again.

A step of forming a first conductive layer 161 for a gate line in a recess between the first material layers 101 of the cell region CELL_R may be performed. For example, the first conductive layer 161 may be formed of a metal material such as tungsten (W), molybdenum (Mo), cobalt (Co), or nickel (Ni), a semiconductor material such as silicon (Si) or polysilicon (Poly-Si), but is not limited thereto. The first conductive layer 161 may be used as a select line or a word line in the cell region CELL_R. After the first conductive layer 161 is formed in the cell region CELL_R, the second mask pattern 151 is removed.

Figure 17:
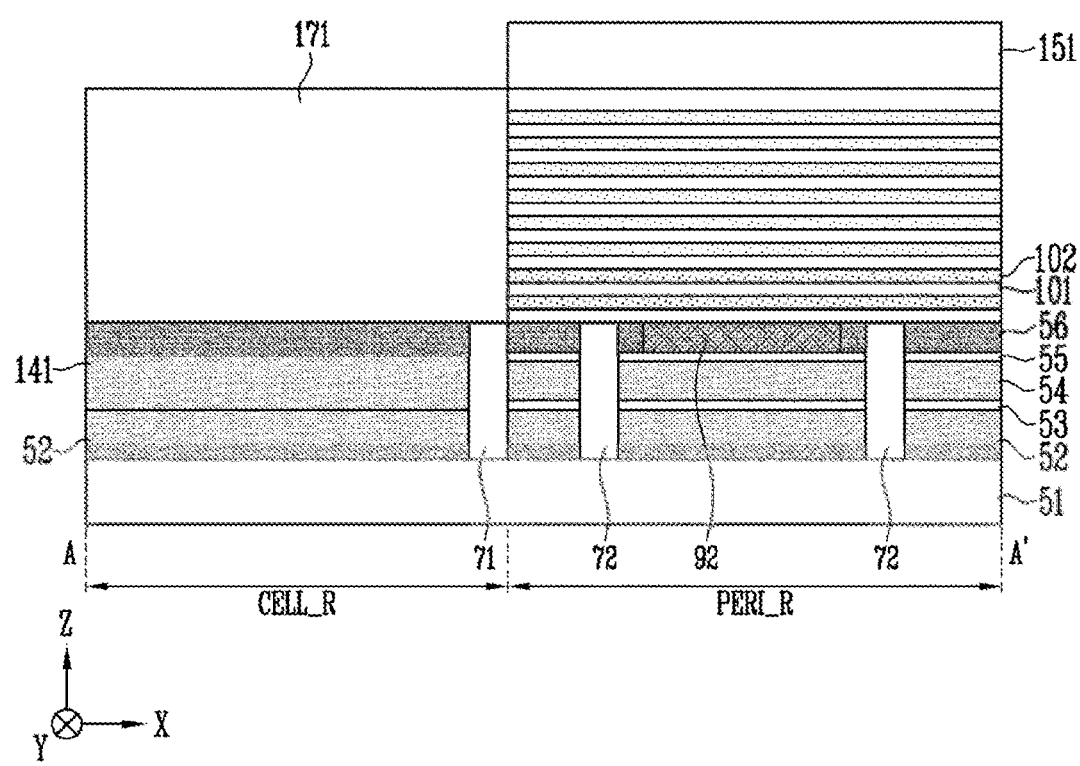

Referring to FIG. 17, the cross-section taken along the line A-A' of the cell region CELL_R and the slit region SLR is shown.

Because the second mask pattern 151 is removed, the fifth trench 121 of the cell region CELL_R may be exposed. When the fifth trench 121 is exposed, a step of filling the fifth trench 121 with the third insulating layer 171 may be performed. The third insulating layer 171 may be formed of oxide or silicon oxide. When the fifth trench 121 is filled with the third insulating layer 171, the first and second block structures 1B_STK and 2B_STK of FIG. 13B may be electrically blocked from each other.

Figure 18:
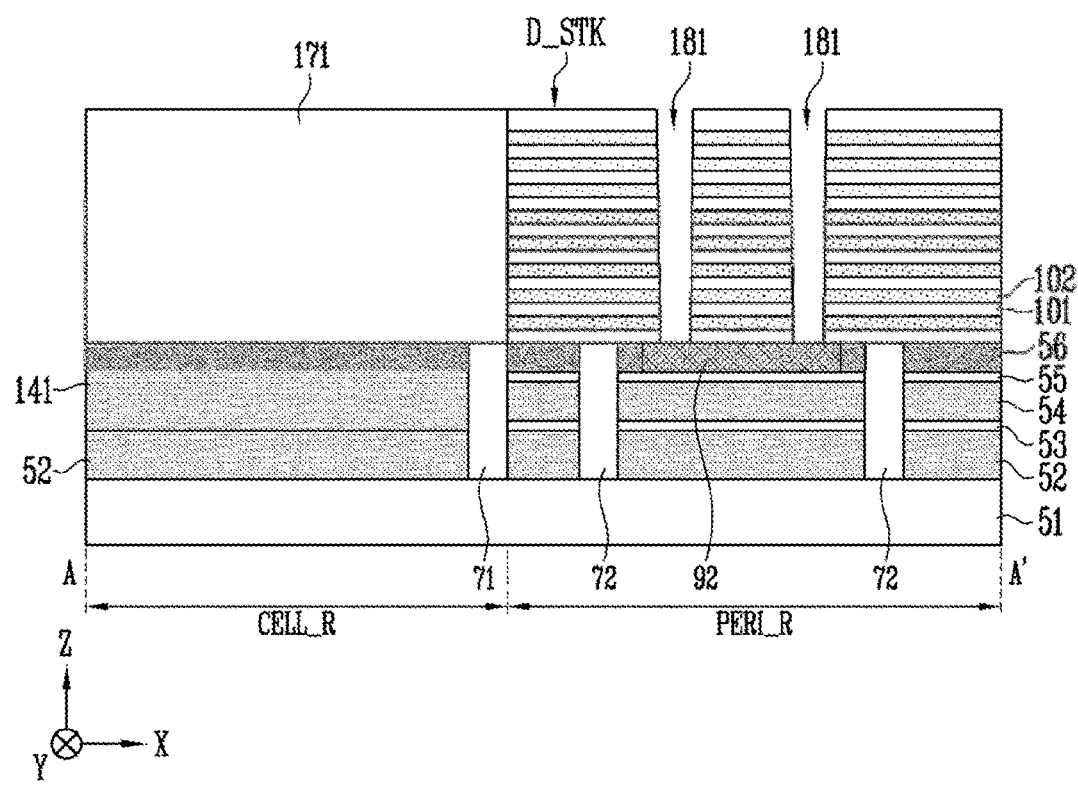

Referring to FIG. 18, an etching process for forming contact holes 181 vertically passing through the dummy structure D_STK may be performed to expose a portion of the second etch stop layer 92 formed in the peripheral circuit region PERI_R. For example, Because the second etch stop layer 92 formed in the peripheral circuit region PERI_R extends along the first direction (X-direction), the contact holes 181 may be formed to expose each of both ends of the second etch stop layer 92. A distance between the contact holes 181 may be adjusted differently according to a resistance value set in the resistor unit. For example, as the resistance value is set lower, the distance between the contact holes 181 and 182 may be formed narrower.

Figure 19:
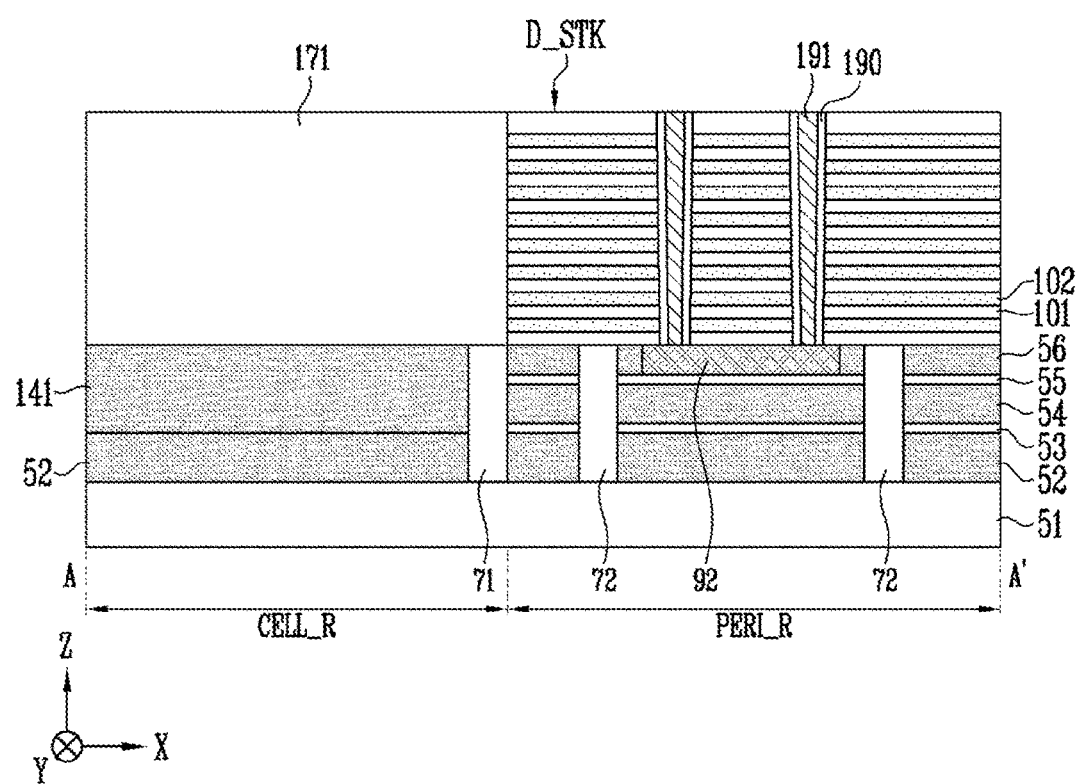

Referring to FIG. 19, a sidewall insulating layer 190 may be formed on a sidewall of the contact holes 181, and the contact holes 181 in which the sidewall insulating layer 190 is formed may be filled with second conductive layers 191. The sidewall insulating layer 190 may be formed of an oxide layer, and the second conductive layers 191 may be formed of a metal material such as tungsten (W), cobalt (Co), nickel (Ni), molybdenum (Mo), aluminum (Al), or copper (Cu).

Figure 20A:
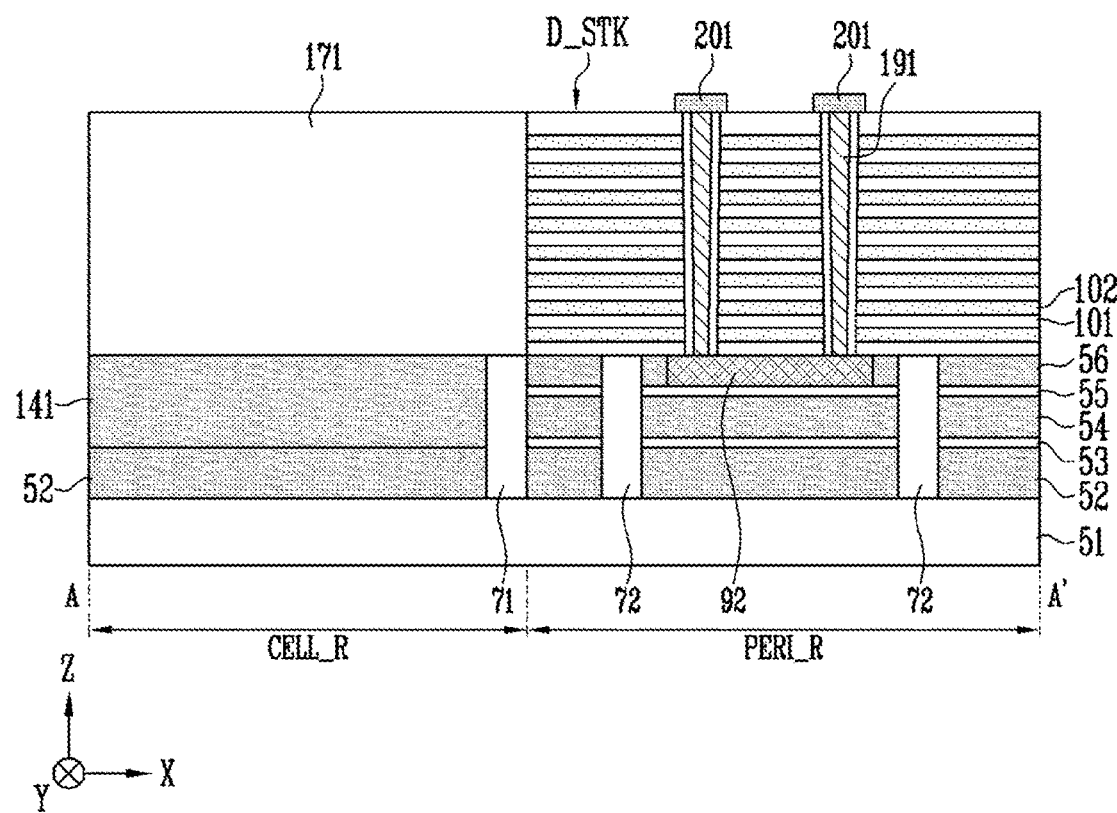
Figure 20B:
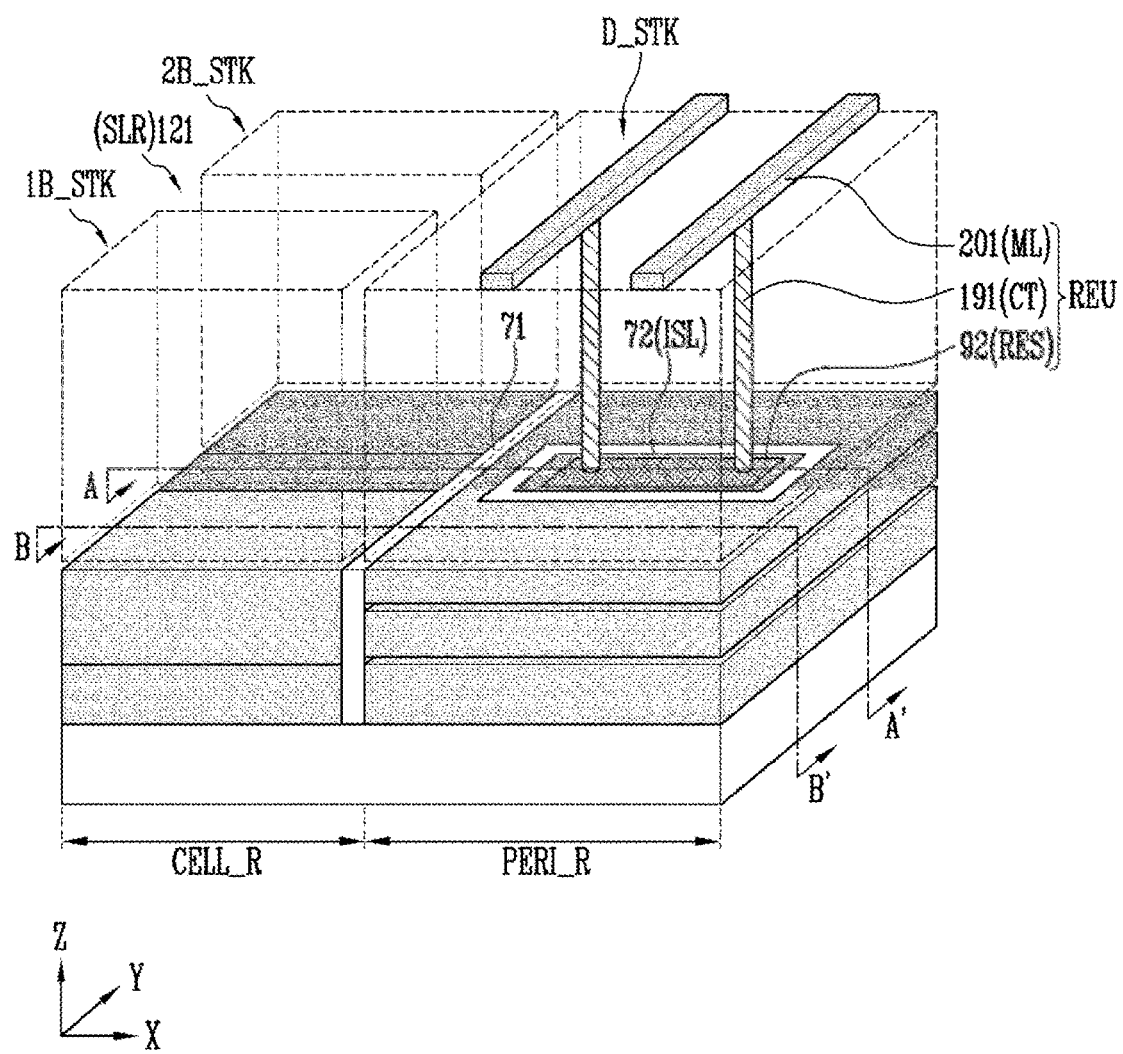

Referring to FIGS. 20A and 20B, conductive patterns 201 may be formed on the second conductive layers 191. The conductive patterns 201 may be formed of a metal material the same as or different from that of the second conductive layers 191. The conductive patterns 201 formed on the different second conductive layers 191 may be formed to be electrically blocked from each other. The conductive patterns 201 may be connected to a circuit using a resistor among the peripheral circuits. Accordingly, the resistor unit REU including the second etch stop layer 92, the second conductive layers 191, and the conductive patterns 201 may be formed. The second etch stop layer 92 may be used as the resistor, the conductive patterns 201 may be used as the metal lines ML connected to the peripheral circuit, and the second conductive layers 191 may be used as the contacts CT electrically connecting the resistor RES and the metal lines ML to each other.

By forming some of the resistor units REU among the resistor units, which are used in the peripheral circuits, in the peripheral circuit region PERI_R in which the dummy structure D_STK is formed, the size of the memory device may be reduced.

Figure 21:
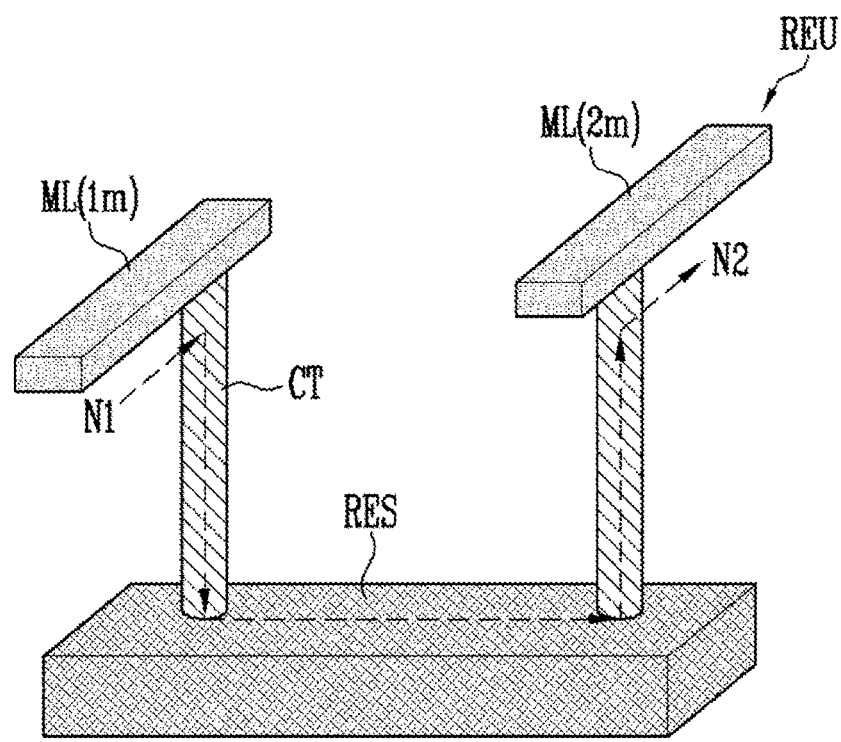
FIG. 21 is a diagram illustrating a structure of a resistor unit formed according to an embodiment of the present disclosure.
Figure 21:
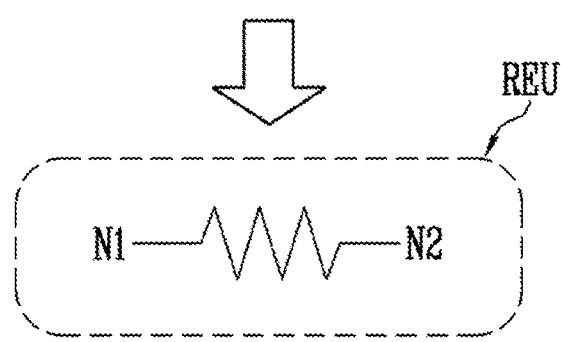

FIG. 21 is a diagram illustrating a structure of a resistor unit formed according to an embodiment of the present disclosure.

Referring to FIG. 21, the resistor unit REU formed according to the present embodiment may include the metal lines ML, the contacts CT, and the resistor RES. The metal lines ML may be connected to the circuit including the resistor unit, and may be used as a first node N1 and a second node N2 electrically connected to each other through the resistor RES in the peripheral circuit. For example, one 1 m of the metal lines ML may be the first node N1 through which a current is input, and the other 2 m of the metal lines ML may be the second node N2 through which a current is output. A resistance value of the resistor unit REU may be adjusted according to a material configuring the resistor RES and a distance between the contacts CT.

Figure 22:
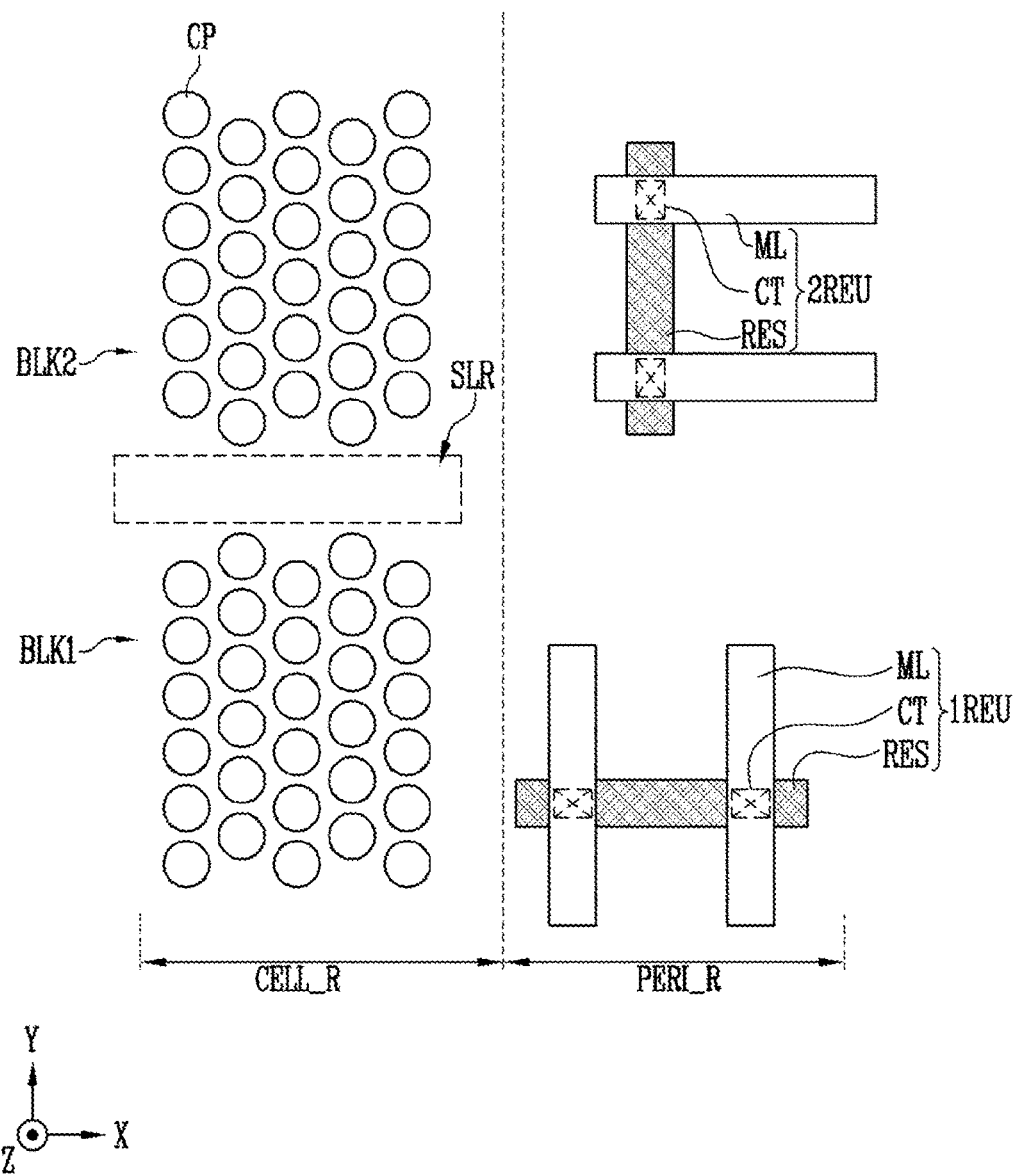
FIG. 22 is a diagram illustrating another structure of a resistor unit formed according to an embodiment of the present disclosure.

FIG. 22 is a diagram illustrating another structure of a resistor unit formed according to an embodiment of the present disclosure.

Referring to FIG. 22, a layout of resistor units 1REU and 2REU formed in the peripheral circuit region PERI_R may have various patterns. In the above-described embodiment, the resistor RES included in the resistor unit is formed on the extension line of the slit region SLR formed in the cell region CELL_R, but as shown in FIG. 22, the first and second resistor units 1REU and 2REU may be formed in various patterns in the peripheral circuit region PERI_R regardless of the slit region SLR.

Figure 23:
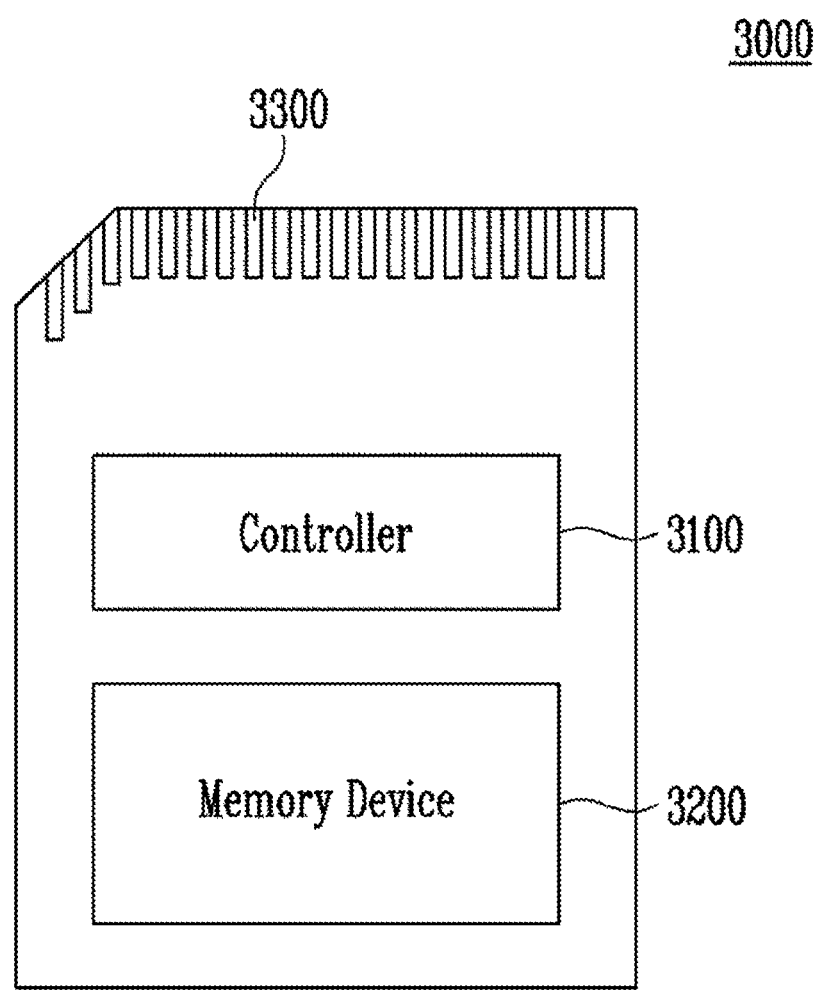
FIG. 23 is a diagram illustrating a memory card system to which a memory device according to an embodiment of the present disclosure is applied

FIG. 23 is a diagram illustrating a memory card system 3000 to which a memory device according to an embodiment of the present disclosure is applied.

Referring to FIG. 23, the memory card system 3000 includes a controller 3100, a memory device 3200, and a connector 3300.

The controller 3100 is connected to the memory device 3200. The controller 3100 is configured to access the memory device 3200. For example, the controller 3100 may be configured to control a program, read, or erase operation of the memory device 3200 or to control a background operation. The controller 3100 is configured to provide an interface between the memory device 3200 and a host. The controller 3100 is configured to drive firmware for controlling the memory device 3200. For example, the controller 3100 may include components such as random access memory (RAM), a processing unit, a host interface, a memory interface, and an error correction circuit.

The controller 3100 may communicate with an external device through the connector 3300. The controller 3100 may communicate with an external device (for example, the host) according to a specific communication standard. For example, the controller 3100 is configured to communicate with an external device through at least one of various communication standards such as a universal serial bus (USB), a multimedia card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe. For example, the connector 3300 may be defined by at least one of the various communication standards described above.

The memory device 3200 may include memory cells, and may be configured identically to the memory device 100 shown in FIG. 1.

The controller 3100 and the memory device 3200 may be integrated into one semiconductor device to configure a memory card. For example, the controller 3100 and the memory device 3200 may be integrated into one semiconductor device to configure a memory card such as a PC card (personal computer memory card international association (PCMCIA)), a compact flash card (CF), a smart media card (SM or SMC), a memory stick, a multimedia card (MMC, RS-MMC, MMCmicro, or eMMC), an SD card (SD, miniSD, microSD, or SDHC), and a universal flash storage (UFS).

Figure 24:
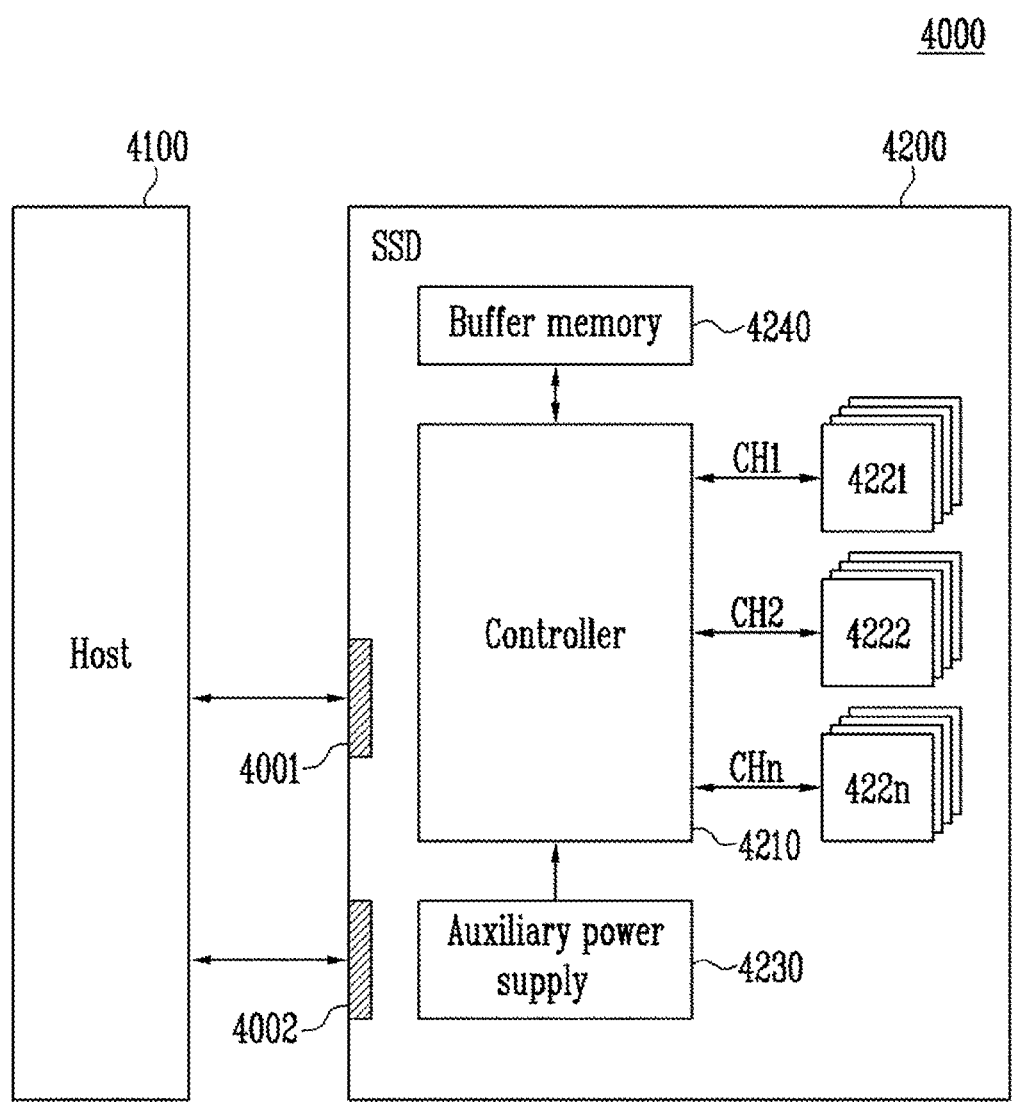
FIG. 24 is a diagram illustrating a solid state drive (SSD) system to which a memory device according to an embodiment of the present disclosure is applied.

FIG. 24 is a diagram illustrating a solid state drive (SSD) system 4000 to which a memory device according to an embodiment of the present disclosure is applied.

Referring to FIG. 24, the SSD system 4000 includes a host 4100 and an SSD 4200. The SSD 4200 exchanges a signal SIG with the host 4100 through a signal connector 4001 and receives power PWR through a power connector 4002. The SSD 4200 includes a controller 4210, a plurality of memory devices 4221 to 422n, an auxiliary power supply 4230, and a buffer memory 4240.

The controller 4210 may control the plurality of memory devices 4221 to 422n in response to the signal received from the host 4100. For example, the signal may be signals based on an interface between the host 4100 and the SSD 4200. For example, the signal may be a signal defined by at least one of interfaces such as a universal serial bus (USB), a multimedia card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe.

The plurality of memory devices 4221 to 422n may include cells capable of storing data. Each of the plurality of memory devices 4221 to 422n may be configured identically to the memory device 100 shown in FIG. 1.

The auxiliary power supply 4230 is connected to the host 4100 through the power connector 4002. The auxiliary power supply 4230 may receive a power voltage from the host 4100 and charge the power voltage. The auxiliary power supply 4230 may provide a power voltage of the SSD 4200 when power supply from the host 4100 is not smooth. For example, the auxiliary power supply 4230 may be positioned in the SSD 4200 or may be positioned outside the SSD 4200. For example, the auxiliary power supply 4230 may be positioned on a main board and may provide auxiliary power to the SSD 4200.

The buffer memory 4240 operates as a buffer memory of the SSD 4200. For example, the buffer memory 4240 may temporarily store data received from the host 4100 or data received from the plurality of memory devices 4221 to 422n, or may temporarily store data (for example, a mapping table) of the memory devices 4221 to 422n. The buffer memory 4240 may include a volatile memory such as a DRAM, an SDRAM, a DDR SDRAM, and an LPDDR SDRAM, or a nonvolatile memory such as an FRAM, a ReRAM, an STT-MRAM, and a PRAM.

What is claimed is:

1. A memory device comprising:
   a source layer over which a cell region and a peripheral circuit region are defined;
   memory blocks formed on the source layer in the cell region;
   a slit formed between the memory blocks;
   a resistor formed in the source layer in the peripheral circuit region;
   contacts formed on the resistor; and
   metal lines formed on the contacts and connected to a peripheral circuit.

2. The memory device of claim 1, further comprising:
   a first insulating layer extending between the cell region and the peripheral circuit region.

3. The memory device of claim 1, further comprising a resistor unit, wherein the resistor unit comprises the resistor, the contacts, and the metal lines.

4. The memory device of claim 3, wherein a resistance value of the resistor unit is based on a distance between the contacts and a material of the resistor.

5. The memory device of claim 1, wherein the resistor comprises at least one of tungsten (W), titanium (Ti), and titanium nitride (TiN).

6. The memory device of claim 1, wherein the resistor is formed in a slit region in which the slit is formed.

7. The memory device of claim 1, further comprising:
   a second insulating layer formed around and under the resistor to electrically isolate the resistor from the source layer in the peripheral circuit region.

8. The memory device of claim 1, further comprising:
   a dummy structure formed on the source layer in the peripheral circuit region.

9. The memory device of claim 8, wherein the dummy structure includes first material layers and second material layers alternately stacked on the source layer.

10. The memory device of claim 9, wherein:
    the first material layers comprise oxide layers, and
    the second material layers comprise nitride layers.

* * * * *